(12) United States Patent
Desmond

(10) Patent No.: US 9,973,163 B1
(45) Date of Patent: May 15, 2018

(54) CONTEXT SENSITIVE PRESENTATION OF MEDIA CONTENT

(71) Applicant: The DIRECTV Group, Inc., El Segundo, CA (US)

(72) Inventor: Randall Desmond, Lawndale, CA (US)

(73) Assignee: The DIRECTV Group, Inc., El Segundo, CA (US)

( * ) Notice: Subject to any disclaimer, the term of this patent is extended or adjusted under 35 U.S.C. 154(b) by 0 days. days.

(21) Appl. No.: 15/441,164

(22) Filed: Feb. 23, 2017

(51) Int. Cl.
*H03G 3/30* (2006.01)
*H04R 29/00* (2006.01)
*H04R 3/04* (2006.01)

(52) U.S. Cl.
CPC ............. *H03G 3/3005* (2013.01); *H04R 3/04* (2013.01); *H04R 29/001* (2013.01); *H04R 2499/11* (2013.01)

(58) Field of Classification Search
None
See application file for complete search history.

(56) References Cited

U.S. PATENT DOCUMENTS

| | | |
|---|---|---|
| 7,278,101 B1 | 10/2007 | Cassezza |
| 8,107,643 B2 | 1/2012 | Oh et al. |
| 8,314,893 B2 | 11/2012 | Ravi |
| 8,345,893 B2 | 1/2013 | Aoki et al. |
| 8,352,052 B1 | 1/2013 | Green et al. |
| 9,444,422 B2 | 9/2016 | Bharj et al. |
| 2014/0240595 A1 | 8/2014 | DiNunzio |
| 2015/0326196 A1 | 11/2015 | Park |
| 2015/0350783 A1* | 12/2015 | Krishnaswamy ...... H04R 3/007 381/55 |
| 2016/0029055 A1 | 1/2016 | Villegas Nunez et al. |
| 2016/0049915 A1 | 2/2016 | Wang et al. |
| 2016/0112735 A1 | 4/2016 | Stephens, Jr. |
| 2016/0254795 A1 | 9/2016 | Ballard |
| 2016/0335043 A1* | 11/2016 | Guyott ................... G06F 3/165 |

FOREIGN PATENT DOCUMENTS

CN 104811809 A 7/2015

* cited by examiner

*Primary Examiner* — Curtis Kuntz
*Assistant Examiner* — Kenny Truong
(74) *Attorney, Agent, or Firm* — Amin, Turocy & Watson, LLP

(57) ABSTRACT

Volume levels of content being presented via a device can be controlled. The device can receive or stream video or audio content. An audio manager component (AMC) can process the content to control the volume level of the content as it is presented on a presentation component based on a set point and/or upper and/or lower threshold volume levels. The set point can be set by a user. The AMC can map a high volume audio signal or a low volume audio signal to a defined volume range around the set point based on the upper and/or lower threshold volume levels. The AMC can analyze respective audio signals of the content, interpolate and determine respective adjusted volume levels of the respective audio signals, and adjust the respective volume levels to the respective adjusted volume levels based on the analysis results and the mapping.

20 Claims, 13 Drawing Sheets

CONTEXT SENSITIVE PRESENTATION OF MEDIA CONTENT

TECHNICAL FIELD

This disclosure relates generally to content presentation, e.g., to context sensitive presentation of media content.

BACKGROUND

When content (e.g., video content, comprising audio content, or audio content) is being presented via a device (e.g., a television, a computer, a media player device, . . . ), the volume of the audio can vary significantly based on the content being presented. For instance, a movie or television program can have sounds that can range from softer dialog or sounds to relatively louder dialog or sounds. Also, there can be a significant difference in volume levels between presentation of a movie or television program and presentation of commercials during commercial breaks between the presentation of the movie or television program.

The above-described description is merely intended to provide a contextual overview relating to presentation of content, and is not intended to be exhaustive.

DETAILED DESCRIPTION

Figure 1:
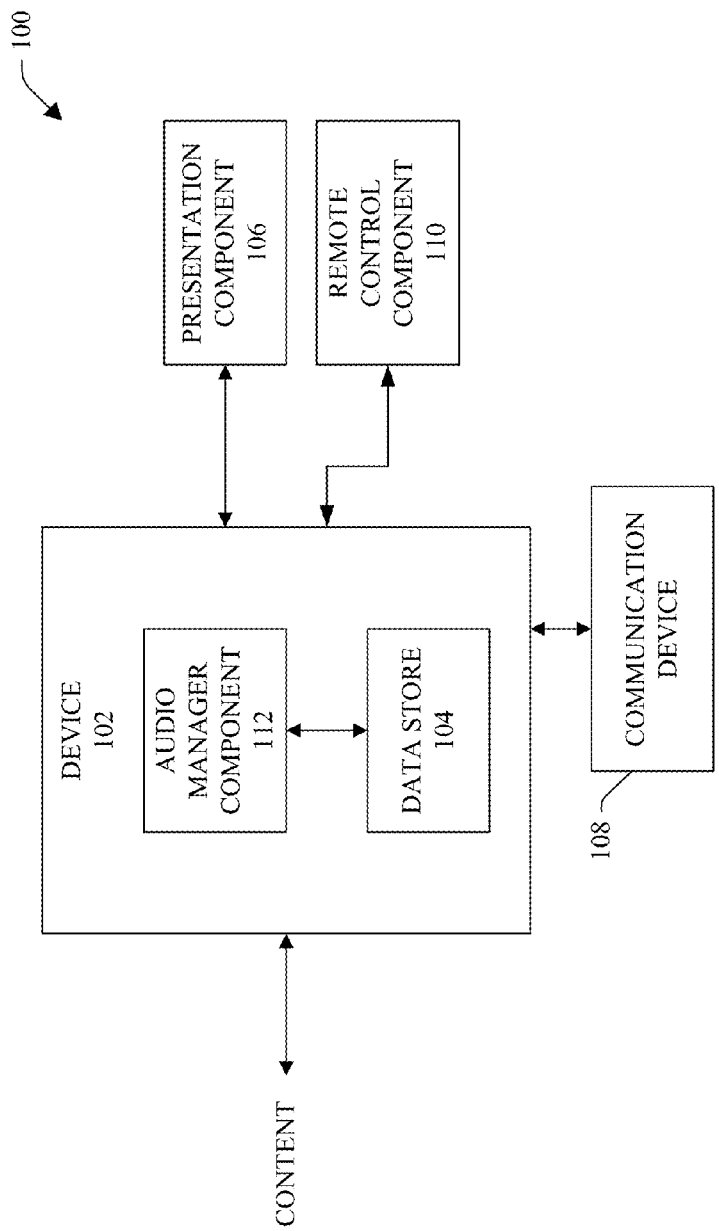
FIG. 1 illustrates a block diagram of an example system that can control volume levels of audio signals of content being presented via a device, in accordance with various aspects and embodiments of the disclosed subject matter.

Various aspects of the disclosed subject matter are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

When content (e.g., video content, comprising audio content, or audio content) is being presented via a device (e.g., a television, a computer, a media player device, . . . ), the volume of the audio can vary significantly based on the content being presented. For instance, a movie or television program can have sounds that can range from softer dialog or sounds to relatively louder dialog or sounds. Also, there can be a significant difference in volume levels between presentation of a movie or television program and presentation of commercials during commercial breaks between the presentation of the movie or television program.

A user can manually adjust the volume control on the device up or down, either directly on the device or via a remote control, to compensate for the differences or changes in volume of content being presented by the device. However, having to repeatedly make manual volume adjustments during the presentation of content can be tedious and burdensome on the user and also can negatively impact the user's ability to enjoy the presentation of the content.

To that end, techniques for controlling volume levels of content (e.g., video content, comprising audio content, or audio content) being presented via a device (e.g., set-top box (STB) or set-top unit (STU)) are presented. The device can receive video or audio content from a content provider device (e.g., via a communication network), wherein the content can be stored in a data store of the device, for example, for future presentation by the device and a presentation component (e.g., television, Internet Protocol (IP) television (IPTV), or other display device) or other communication device (e.g., mobile phone, computer, electronic pad or tablet, electronic eyewear, . . . ) associated with the device. The device also can stream video or audio content for presentation via the presentation component or other communication device.

An audio manager component can process the content to control the volume level of the content as it is presented on a presentation component based on a set point and/or upper and/or lower threshold volume levels. The audio manager component can receive audio parameters, such as a set point (e.g., set point volume level), an upper threshold volume level, and/or a lower threshold volume level, via an interface on the device or from a communication device (e.g., mobile phone, remote control, computer, . . . ) of a user. The audio manager component can generate a mapping that maps a high volume audio signal and/or a low volume audio signal to a defined volume range around the set point based on the upper and/or lower threshold volume levels. When processing the content, the audio manager component can analyze respective audio signals of the content, interpolate and determine respective adjusted volume levels of the respective audio signals, and adjust the respective volume levels to the respective adjusted volume levels based at least in part on the analysis results and the mapping. The content, with the respective adjusted volume levels for the respective audio signals, can be communicated to the presentation component or other communication device for presentation on the presentation component or other communication device.

In some implementations, the audio manager component can be employed to clip the volume levels of the audio signals of the content based at least in part on upper and/or lower threshold volume levels. For instance, while employing a clipping mode, the audio manager component can analyze the audio signals of the content, identify any audio signals that breach the upper threshold volume level and/or lower threshold volume level, and clip such audio signals that exceed the upper threshold volume level and/or lower threshold volume level to adjust the volume levels of certain of those audio signals to a upper volume level that matches the upper threshold volume level with regard to audio signals that are higher than that threshold and adjust the volume levels of other of those audio signals to a lower volume level that matches the lower threshold volume level with regard to audio signals that are lower than that threshold. The audio manager component can maintain as-is the other audio signals of the content that do not breach the upper threshold volume level and/or lower threshold volume level.

These and other aspects and embodiments of the disclosed subject matter will now be described with respect to the drawings.

Referring now to the drawings, FIG. 1 illustrates a block diagram of an example system 100 that can control volume levels of audio signals of content being presented via a device, in accordance with various aspects and embodiments of the disclosed subject matter. The system 100 can comprise a device 102 that can receive content (e.g., video or audio content) from one or more content sources, such as, for example, a content provider device (not shown in FIG. 1) associated with the device 102 (e.g., via a communication network).

The device 102 can be or comprise a media device (e.g., a set-top box (STB) or set-top unit (STU)). It is to be appreciated and understood that, while the device 102, is often described herein as being as an STB or STU, the disclosed subject matter is not so limited, as, in accordance with various embodiments, the device 102 can be or can comprise, for example, a mobile phone (e.g., smart phone), a computer, electronic eyewear, electronic watch (e.g., smart watch), electronic gaming device, or other type of communication device.

The device 102 can be employed to record or store the content in a data store 104 of (or associated with) the device 102. The content can be stored in the data store 104, for example, for future presentation by the device 102 and a presentation component 106 (e.g., television, IPTV, or other display device) or other communication device 108 (e.g., mobile phone, computer, electronic pad or tablet, electronic eyewear, . . . ) associated with the device 102. The device 102 also can stream the content for presentation via the presentation component 106 or other communication device 108 associated with the device 102.

A user can use controls on an interface of the device 102, controls on an interface of the presentation component 106, controls on an interface of the communication device 108, or controls on an interface of a remote control component 110 to facilitate controlling the receiving, streaming, storing, processing (e.g., adjusting volume levels), and/or presenting of the content via the device 102. The remote control component 110 can be associated with the device 102 and/or the presentation component 106.

The device 102 can comprise an audio manager component 112 that can control volume levels of audio signals of content for presentation via the presentation component 106 or communication device 108, in accordance with defined control criteria. For instance, the audio manager component 112 can be context sensitive with regard to the content and can control (e.g., adjust, modify, vary) volume levels of the audio signals of the content based at least in part on the context of the audio signals of the content (e.g., the relative volume levels of audio signals to each other, the audio dynamics of the audio signals in relation to each other). The audio manager component 112 can process content being received from external sources, such as content provider devices of content providers. The audio manager component 112 can be associated with the data store 104 to facilitate retrieving data (e.g., content, metadata, user profile data, . . . ) from the data store 104, storing data in the data store 104, or processing content.

In some implementations, the audio manager component 112 can control (e.g., adjust) volume levels of audio signals of content based at least in part on a set point (e.g., set point volume level), an upper threshold volume level (e.g., a defined upper threshold volume level), and/or a lower threshold volume level (e.g., a defined lower threshold volume level). The set point, upper threshold volume level, and/or lower threshold volume level can be selected or set by a user, and/or selected or set by the audio manager component 112, in accordance with the defined control criteria, wherein the audio manager component 112 also can recommend or suggest desirable or potentially desirable set points and threshold volume levels (e.g., upper and/or lower threshold volume levels).

The set point can be a desired, optimal, or mid-based volume level for audio signals of content when being presented to the user via the presentation component 106 or communication device 108. The upper threshold volume level can be a desired maximum volume level for audio signals of content when being presented to the user via the presentation component 106 or communication device 108. The lower threshold volume level can be a desired minimum volume level for audible audio signals of content when being presented to the user via the presentation component 106 or communication device 108.

Figure 2:
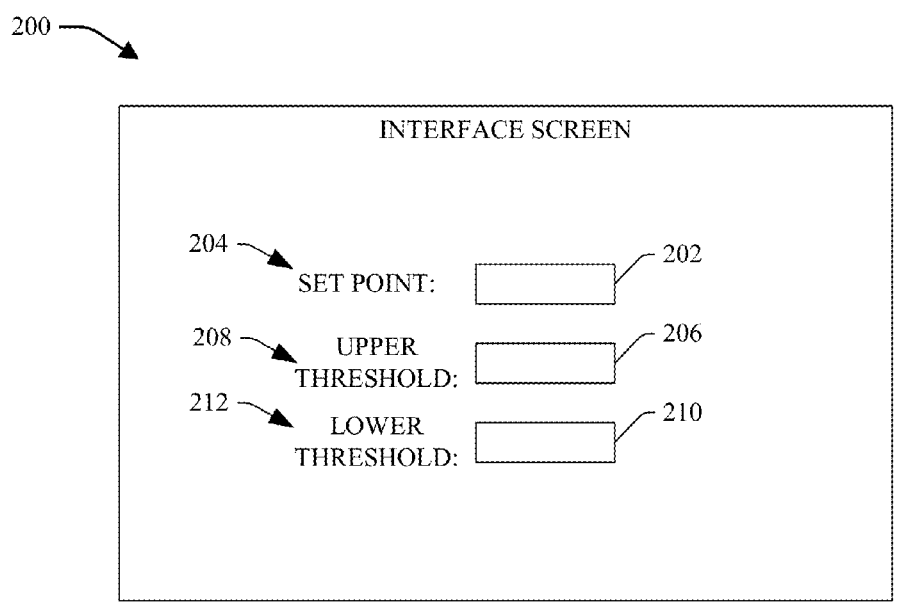
FIG. 2 depicts a diagram of an example interface screen that can facilitate selection of a set point, an upper threshold volume level, and/or a lower threshold volume level to facilitate controlling volume levels of audio signals of content being presented via the device, in accordance with various aspects and embodiments of the disclosed subject matter.

To facilitate selecting and setting of the set point, upper threshold volume level, lower threshold volume level, and/or other audio parameters, the audio manager component 112 can generate interface screens, data fields, controls, buttons, menus, etc., and can facilitate presenting the interface screens, data fields, controls, buttons, menus, etc., to the user via an interface on the device 102, an interface on the presentation component 106, an interface on the communication device 108, and/or an interface on the remote control component 110. Referring briefly to FIG. 2 (along with FIG. 1), FIG. 2 depicts a diagram of an example interface screen 200 that can facilitate selection of a set point, an upper threshold volume level, and/or a lower threshold volume level to facilitate controlling volume levels of audio signals of content being presented via the device, in accordance with various aspects and embodiments of the disclosed subject matter. The audio manager component 112 can generate the interface screen 200 and facilitate presentation of the interface screen 200 via a display screen of the device 102, a display screen of the presentation component 106, or a display screen of the communication device 108.

The interface screen 200 can comprise and/or present various information, data fields, menus (e.g., drop-down menus), buttons, and/or controls, etc., to facilitate selecting the set point, upper threshold volume level, and/or lower threshold volume level, and/or providing information relating to the set point, upper threshold volume level, and/or lower threshold volume level, to facilitate controlling volume levels of audio signals of content being presented via the device 102. The interface screen 200 can be presented to the user via a display screen of the device 102, the presentation component 106, or the communication device 108, for example. The user can use (e.g., manipulate) buttons or controls on a display screen (e.g., touch screen), another interface, a keyboard or keypad, etc., of the device 102, presentation component 106, communication device 108, or remote control component 110 to set or select the set point, upper threshold volume level, lower threshold volume level, and/or other parameters relating to controlling the volume or other parameters (e.g., equalization parameters) of audio signals of content.

In some implementations, the interface screen 200 can include a first data field 202 for or in which a set point value (e.g., set point level) for a set point 204 can be selected or inserted by a user via interface controls of the device 102, the presentation component 106, the communication device 108, or the remote control component 110. In some implementations, a default set point value or recommended set point value initially can be inserted in the first data field 202 (e.g., by the audio manager component 112), which the user can use by default, or the user can select or insert a desired set point value for or in the first data field 202. In certain implementations, selecting, highlighting, or having a cursor hover over the first data field 202 can cause a menu of available set point values and/or types of content (e.g., movie, television program, music video, audio music, . . . ) associated with (e.g., related or mapped to) available set point values to be displayed on the interface screen 200, wherein the user can use the interface controls to select the desired set point value from the menu. Using an interface control to select or hover over a type of content in the menu can result in presentation (e.g., by the audio manager component 112) of another menu (e.g., a sub-menu) of sub-types of content, such as type of movie (e.g., action movie, drama, comedy, suspense movie, . . . ), type of television program (e.g., talk show, comedy, drama, news, . . . ), type of music video or audio music (e.g., rock, pop, country, jazz, classical, . . . ). Selection of a type of content or sub-type of content can cause a set point value that relates to (e.g., is linked or mapped to) the type of content or sub-type of content to be inserted in the first data field 202 to set the set point 204 (e.g., by the audio manager component 112). There can be respective (e.g., different) set point values for respective types of content and/or sub-types of content, in accordance with the defined control criteria.

The interface screen 200 also can comprise a second data field 206 for or in which an upper threshold volume value for the upper threshold volume level 208 can be selected or inserted by the user via interface controls of the device 102, the presentation component 106, the communication device 108, or the remote control component 110. In certain implementations, a default upper threshold volume value or recommended upper threshold volume value initially can be inserted in the second data field 206 (e.g., by the audio manager component 112), which the user can use by default, or the user can select or insert a desired upper threshold volume value for or in the second data field 206. Selecting, highlighting, or having a cursor hover over the second data field 206 can cause a menu of available upper threshold volume values and/or types of content associated with (e.g., related or mapped to) available upper threshold volume value to be displayed on the interface screen 200 (e.g., as facilitated by the audio manager component 112), wherein the user can use the interface controls to select the desired upper threshold volume value from the menu. Using an interface control to select or hover over a type of content in the menu also can result in presentation (e.g., by the audio manager component 112) of another menu (e.g., a sub-menu) of sub-types of content, such as type of movie, type of television program, or type of music video or audio music. Selection of a type of content or sub-type of content by the user can cause an upper threshold volume value that relates to (e.g., is linked or mapped to) the type of content or sub-type of content to be inserted in the second data field 206 (e.g., by the audio manager component 112) to set the upper threshold volume level 208. There can be respective (e.g., different) upper threshold volume values for respective types of content and/or sub-types of content, in accordance with the defined control criteria. If desired, the user can have no upper threshold volume level set.

The interface screen 200 further can include a third data field 210 for or in which a lower threshold volume value for the lower threshold volume level 212 can be selected or inserted by the user via interface controls of the device 102, the presentation component 106, the communication device 108, or the remote control component 110. In some implementations, a default lower threshold volume value or recommended lower threshold volume value initially can be inserted in the third data field 210 (e.g., by the audio manager component 112). The user can have the option to use the default lower threshold volume value or recommended lower threshold volume value by default, or the user can select or insert a desired lower threshold volume value for or in the third data field 210. Selecting, highlighting, or having a cursor hover over the third data field 210 by the user can cause a menu of available lower threshold volume values and/or types of content associated with (e.g., related or mapped to) available lower threshold volume value to be displayed on the interface screen 200 (e.g., as facilitated by the audio manager component 112). The user can use the interface controls to select the desired lower threshold volume value from the menu. Using an interface control to select or hover over a type of content in the menu also can result in presentation (e.g., by the audio manager component 112) of another menu (e.g., a sub-menu) of sub-types of content, such as type of movie, type of television program, or type of music video or audio music. Selection of a type of content or sub-type of content can cause a lower threshold volume value that relates to (e.g., is linked or mapped to) the type of content or sub-type of content to be inserted in the third data field 210 (e.g., by the audio manager component 112) to set the lower threshold volume level 212. There can be respective (e.g., different) lower threshold volume values for respective types of content and/or sub-types of content, in accordance with the defined control criteria. If desired, the user can have no lower threshold volume level set.

Figure 3:
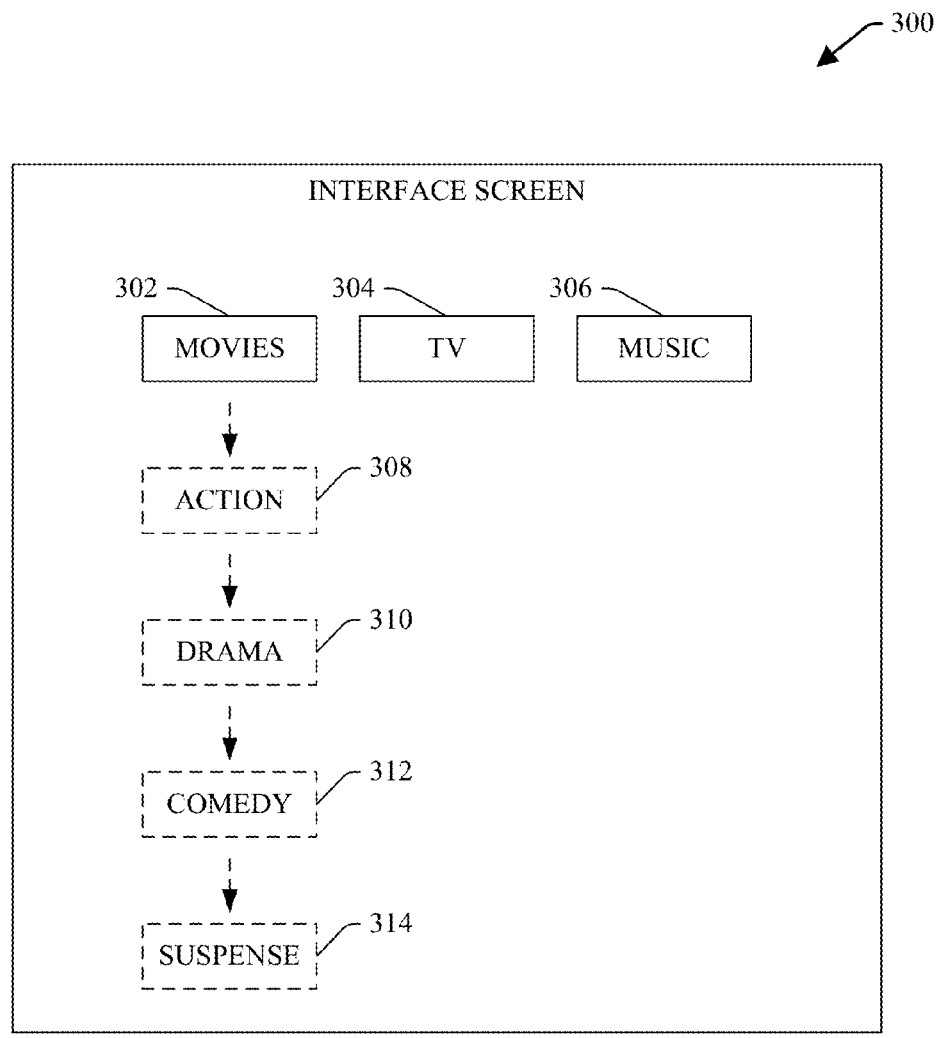
FIG. 3 presents a diagram of another example interface screen that can facilitate selection of a set point, an upper threshold volume level, and/or a lower threshold volume level to facilitate controlling volume levels of audio signals of content being presented via the device, in accordance with various aspects and embodiments of the disclosed subject matter.

Turning briefly to FIG. 3 (along with FIG. 1), FIG. 3 presents a diagram of another example interface screen 300 that can facilitate selection of a set point, an upper threshold volume level, and/or a lower threshold volume level to facilitate controlling volume levels of audio signals of content being presented via the device, in accordance with various aspects and embodiments of the disclosed subject matter. The audio manager component 112 can generate the interface screen 300 and facilitate presentation of the interface screen 300 via a display screen of the device 102, a display screen of the presentation component 106, or a display screen of the communication device 108.

The interface screen 300, as generated by the audio manager component 112, can comprise and/or present various information, buttons, controls, and/or menus (e.g., drop-down menus), etc., to facilitate selecting the set point, upper threshold volume level, and/or lower threshold volume level, and/or providing (e.g., to a user) information relating to the set point, upper threshold volume level, and/or lower threshold volume level, to facilitate controlling volume levels of audio signals of content being presented via the device 102. The interface screen 300 can be presented (e.g., as facilitated by the audio manager component 112) via a display screen of the device 102, a display screen of the presentation component 106, or a display screen of the communication device 108, instead, in addition to, or as an alternative to, the interface screen 200, for example. The user can use (e.g., manipulate) buttons or controls on a display screen (e.g., touch screen), another interface, a keyboard or keypad, etc., of the device 102, presentation component 106, communication device 108, or remote control component 110 to set or select the set point, upper threshold volume level, lower threshold volume level, and/or other parameters relating to controlling the volume or other parameters (e.g., equalization parameters) of audio signals of content.

For instance, the interface screen 300 can include a plurality of buttons that can be associated with respective set point levels, upper threshold volume levels, and/or lower threshold volume levels (e.g., respective pre-set values for the set point, upper threshold volume, and/or lower threshold volume). The plurality of buttons can comprise, for example, a movie button 302 that can include respective set point levels, upper threshold volume levels, and/or lower threshold volume levels that can vary based at least in part on the defined control criteria and/or type of movie. The plurality of buttons also can include a TV button 304 that can include respective set point levels, upper threshold volume levels, and/or lower threshold volume levels that can vary based at least in part on the defined control criteria and/or type of TV program. As another example, the plurality of buttons can comprise a music button 306 that can include respective set point levels, upper threshold volume levels, and/or lower threshold volume levels that can vary based at least in part on the defined control criteria and/or type of TV program.

As desired, the user can use a control of the device 102, presentation component 106, communication device 108, or remote control component 110 to select the movie button 302, the TV button 304, the music button 306, or other button of the plurality of buttons, as desired. In some implementations, in response to selection of a button (e.g., 302, 304, or 306) the audio manager component 112 can select or set a set point value (e.g., defined or pre-set set point value (e.g., volume level value)), upper threshold volume level (e.g., defined upper threshold volume value), and/or lower threshold volume value (e.g., defined lower threshold volume value). Additionally or alternatively, the audio manager component 112 can facilitate having the interface screen 300 display a menu(s) comprising a range of set point values, a range of upper threshold volume values, and/or a range of lower threshold volume values that can be determined based at least in part on the defined control criteria and/or the type of movie.

Additionally or alternatively, in response to selection of a button, such as the movie button 302, the audio manager component 112 can facilitate presenting, via the interface screen 300, one or more additional buttons (e.g., sub-buttons) associated with respective sub-types of content (e.g., sub-types of movies), wherein the one or more additional buttons can comprise, for example, an action movie button 308, a drama movie button 310, a comedy movie button 312, and/or a suspense movie button 314. Each of the one or more additional buttons (e.g., action movie button 308, drama movie button 310, comedy movie button 312, suspense movie button 314) can respectively be associated with a set point value, upper threshold volume value, and/or lower threshold volume value.

For example, in response to selection of the action movie button 308, the audio manager component 112 can set or facilitate the display of (e.g., for selection) a first set point value, first upper threshold volume value, and/or first lower threshold volume value that can be associated with action movies, based at least in part on the defined control criteria. As another example, in response to selection of the drama movie button 310, the audio manager component 112 can set or facilitate the display of (e.g., for selection) a second set point value, second upper threshold volume value, and/or second lower threshold volume value that can be associated with drama movies, based at least in part on the defined control criteria.

In some implementations, the audio manager component 112 can generate or select a mapping that can facilitate controlling volume levels of audio signals of content being presented via the device 102, based at least in part on the set point, the upper threshold volume level, and/or the lower threshold volume level, in accordance with the defined control criteria. The mapping can map respective interpolated or adjusted volume levels, and/or or respective amounts of adjustment to volume levels, to respective (original) volume levels of audio signals of content based at least in part on the set point, the upper threshold volume level, and/or the lower threshold volume level. For example, with regard to a particular volume level of a particular audio signal of content, the interpolated or adjusted volume level, and/or or the amount of adjustment to the volume level, can be determined based at least in part on the set point (e.g., set point volume level), the upper threshold volume level, and/or the lower threshold volume level (e.g., relative to each other). The audio manager component 112 can adjust the respective volume levels of respective audio signals of the content to respective adjusted volume levels and can facilitate the presentation of the respective audio signals at the respective adjusted volume levels as the content is being presented by the device 102 via the presentation component 106 or communication device 108.

The mapping curve of the adjusted volume levels, or the mapping curve of the amounts of adjustment to volume levels, of audio signals of content can vary based at least in part on the variances in the set point, the upper threshold volume level, and/or the lower threshold volume level relative to each other. For example, the audio manager component 112 can generate a first mapping based at least in part on a set point at a first set point volume level (e.g., 60 decibels (dB)), an upper threshold volume level at a first upper threshold volume level (e.g., 85 dB), and a lower threshold volume level at a first lower threshold volume level (e.g., 35 dB). The audio manager component 112 can generate a second mapping based at least in part on a set point at a second set point volume level (e.g., 55 decibels (dB)), an upper threshold volume level at a second upper threshold volume level (e.g., 75 dB), and a lower threshold volume level at a second lower threshold volume level (e.g., 27 dB). The first mapping curve (e.g., the shape and parameter values of the first mapping curve) of the first mapping can be different from the second mapping curve (e.g., the shape and parameter values of the second mapping curve) of the second mapping due in part to the differences in the set points, upper threshold volume levels, and lower threshold volume levels.

Figure 4:
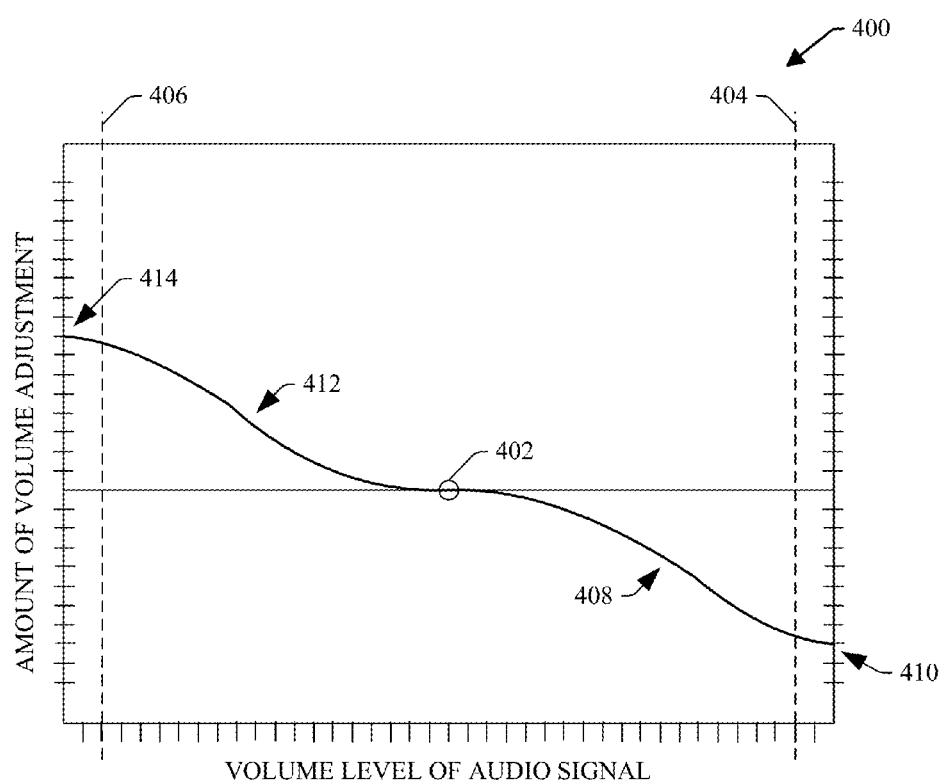
FIG. 4 illustrates a diagram of an example mapping that can facilitate controlling volume levels of audio signals of content being presented via the device, in accordance with various aspects and embodiments of the disclosed subject matter.

Referring briefly to FIG. 4 (along with FIG. 1), FIG. 4 illustrates a diagram of an example mapping 400 that can facilitate controlling volume levels of audio signals of content being presented via the device, in accordance with various aspects and embodiments of the disclosed subject matter. The audio manager component 112 can generate and/or employ the mapping 400 to facilitate adjusting volume levels of audio signals of content to desirable control volume levels during presentation of the content via the presentation component 106 or communication device 108, in accordance with the defined control criteria.

The audio manager component 112 (or another component associated therewith) can determine and/or generate the shape or curve of a particular mapping (e.g., mapping 400) based at least in part on a set point (e.g., a selected set point), an upper threshold volume level, a lower threshold volume level, a high (e.g., a higher, highest, or estimated highest volume level) audio signal of the content being presented, a low (e.g., a lower, lowest, or estimated lowest volume level) audio signal of the content being presented, a type or sub-type of content, and/or other factors, in accordance with the defined control criteria.

For example, the audio manager component 112 (or another component associated therewith) can determine and/or generate the example mapping 400 (e.g., determine and/or generate a curve or shape (e.g., a mapping curve or shape relating to a volume level adjustment) of the mapping 400) based at least in part on the set point 402, an upper threshold volume level 404, a lower threshold volume level 406, a high (e.g., a higher, highest, or estimated highest volume level) audio signal of the content being presented, a low (e.g., a lower, lowest, or estimated lowest volume level) audio signal of the content being presented, a type or sub-type of content, and/or other factors, in accordance with the defined control criteria.

In some implementations, the example mapping 400 can be part of an overall mapping that can facilitate controlling volume levels of audio signals of content being presented via the device. For instance, with respect to a particular volume level of a particular audio signal of content, the example mapping 400 can indicate or specify an amount of volume adjustment that can be to be applied to the particular audio signal to generate an adjusted volume level of the particular audio signal based at least in part on the particular volume level of the particular audio signal and the shape or curve of the mapping 400. The overall mapping related to and/or based at least in part on the mapping 400 can indicate or specify respective adjusted volume levels of respective audio signals of content for respective volume levels of the respective audio signals of the content. For example, the overall mapping can indicate or specify that a first volume level of a first audio signal of the content is to be adjusted to a first adjusted volume level, a second volume level of a second audio signal of the content is to be adjusted to a second adjusted volume level, etc.

As depicted in the mapping 400, with regard to a portion 408 of the mapping 400 between the set point 402 and the upper end 410 of the mapping 400, which, as shown in the mapping 400, can extend beyond, the upper threshold volume level 404, the volume level adjustment can be a decrease in the volume level of an audio signal that has a volume level located in the region of the mapping 400 between the set point 402 and the upper end 410 of the mapping 400 (e.g., that has a volume level along the x-axis between the set point 402 and the upper end 410 of the mapping 400). As also depicted in the mapping 400, with regard to another portion 412 of the mapping 400 between the set point 402 and a lower end 414 of the mapping 400, which, as shown in the mapping 400, can extend beyond, the lower threshold volume level 406, the volume level adjustment can be an increase in the volume level of an audio signal that has a volume level located in the region of the mapping 400 between the set point 402 and the lower end 414 of the mapping 400 (e.g., that has a volume level along the x-axis between the set point 402 and the lower end 414 of the mapping 400).

In some implementations, as illustrated in the mapping 400, the amount of volume adjustment to decrease the volume of audio signals can be higher towards the upper end 410 of the curve of the mapping 400 relative to the amount of volume adjustment at or near the set point 402, with the amount of volume adjustment to decrease the volume of audio signals gradually decreasing as the mapping curve proceeds from the upper end 410 of the curve of the mapping 400 to the set point 402. As a result, a first volume level of a first audio signal above the upper threshold volume level 404 can be decreased more than a second volume level of a second audio signal that is below, but relatively close to, the upper threshold volume level 404, wherein the second volume level of the second audio signal can be decreased more than a third volume level of a third audio signal that is above, but relatively closer to, the set point 402 than the second audio signal.

As also illustrated in the mapping 400, the amount of volume adjustment to increase the volume of audio signals can be higher towards the lower end 414 of the curve of the mapping 400, with the amount of volume adjustment to increase the volume gradually decreasing as the mapping curve proceeds from the lower end 414 of the curve of the mapping 400 to the set point 402. As a result, a first volume level of a first audio signal below the lower threshold volume level 406 can be increased more than a second volume level of a second audio signal that is above, but relatively close to, the lower threshold volume level 404, wherein the second volume level of the second audio signal can be increased more than a third volume level of a third audio signal that is below, but relatively closer to, the set point 402 than the second audio signal.

It is to be appreciated and understood that the mapping 400 is but one example of a mapping that can be employed to facilitate controlling volume levels of audio signals of content. In accordance with various implementations, the shape or curve of the mapping (e.g., mapping 400) generated or employed by the audio manager component 112 can vary or be modified (e.g., by the audio manager component 112) based at least in part on variances of or modifications to the set point 402, the upper threshold volume level 404, the lower threshold volume level 406, the high volume level (e.g., a higher, highest, or estimated highest volume level) of a high audio signal of the content being presented, the low volume level (e.g., a lower, lowest, or estimated lowest volume level) of a low audio signal of the content being presented, the type or sub-type of content, and/or other factors, in accordance with the defined control criteria.

In certain implementations, a mapping curve or shape of a mapping (e.g., mapping 400) generated by the audio manager component 112 can vary as a function of a difference between the upper threshold volume level and the set point volume level, a difference between the lower threshold volume level and the set point volume level, a difference(s) between a high volume level (e.g., a higher, highest, or estimated highest volume level) of a high audio signal of content and the upper threshold volume level and/or the set point volume level, a difference(s) between a low volume level (e.g., a lower, lowest, or estimated lowest volume level) of a low audio signal of content and the low threshold volume level and/or the set point volume level, and/or other factors or audio parameters, in accordance with the defined control criteria. For example, a portion of a mapping curve or shape (e.g., relating to volume level adjustments) of one mapping (e.g., generated by the audio manager component 112) can have a higher or steeper slope, and corresponding volume level adjustments, when the difference between an upper threshold volume level and a set point volume level is smaller as compared to a portion of another mapping curve or shape of another mapping (e.g., generated by the audio manager component 112) that can have a relatively lower or less steep slope, and corresponding volume level adjustments, when the difference between another upper threshold volume level and the set point volume level (or between the upper threshold volume level and another set point volume level) is relatively larger.

In some implementations, prior to presenting content to the presentation component 106 or communication device 108 viewing or listening by the user, the audio manager component 112 can analyze all or a desired portion (e.g., a section) of content (e.g., all of the content or a section of the content covering a defined period of time) to identify an audio signal having the highest volume level and/or another audio signal having the lowest audible volume level. From this analysis, the audio manager component 112 can generate a mapping that can have a mapping curve or shape that can be structured or tailored based at least in part on the audio signal having the highest volume level and/or the other audio signal having the lowest audible volume level, as well as the set point, the upper threshold volume level, and/or the lower threshold volume level, in accordance with the defined control criteria.

In other implementations, all or a portion (e.g., a section) of the content can be analyzed by another component (e.g., a component of a content provider) prior to the content being communicated or streamed to the device 102. The other component can determine or identify the audio signal having the highest volume level and/or the other audio signal having the lowest audible volume level in the content, or portion thereof, and can generate one or more audio indicators, such as a high audio indicator that can indicate a highest volume level of the audio signals in the content and/or a low audio indicator that can indicate a lowest audible volume level of the audio signals in the content.

The audio manager component 112 can receive the one or more audio indicators (e.g., high audio indicator and/or low audio indicator) as metadata with the content in connection with receiving or streaming the content. The audio manager component 112 can analyze the one or more audio indicators to determine or identify the highest volume level and/or the lowest audible volume level in the content, or portion thereof. Based at least in part on the results of this analysis of the one or more audio indicators, the audio manager component 112 can generate a mapping that can have a mapping curve or shape that can be structured or tailored based at least in part on the highest volume level and/or the lowest audible volume level of the content, or portion thereof, as well as the set point, the upper threshold volume level, and/or the lower threshold volume level, in accordance with the defined control criteria.

In still other implementations, as the content is being presented to the user from the device 102 via the presentation component 106 or communication device 108, the audio manager component 112 can adaptively determine, generate, and/or adjust a mapping (e.g., a curve or shape of a mapping) relating to volume level adjustments to use to adjust volume levels of audio signals of content to facilitate controlling volume levels of audio signals of the content being presented, in accordance with the defined control criteria. The audio manager component 112 can perform such adaptive mapping, for example, if the content has not been pre-analyzed to identify an audio signal(s) having a highest volume level and/or a lowest audible volume level in the content, and no audio indicators have been provided to the audio manager component 112 to indicate the highest volume level and/or lowest audible volume level in the content.

For instance, the audio manager component 112 can generate an initial mapping relating to volume level adjustments to adjust volume levels of content based at least in part on a set point, an upper threshold volume level, a lower threshold volume level, an initial (e.g., estimated) highest volume level to be used with regard to the content, and/or an initial (e.g., estimated) lowest audible volume level to be used with regard to the content. The audio manager component 112 can determine the initial (e.g., estimated) highest volume level and/or the initial (e.g., estimated) lowest audible volume level, for example, as respective default volume levels or based at least in part on other factors, such as the type and/or sub-type of the content. As an example, an action movie often can have one or more scenes that can have a louder volume level than the loudest volume level of a drama movie or comedy movie; thus, the initial (e.g., estimated) highest volume level used for an action movie typically can be higher than the initial highest volume level used for a drama or comedy movie.

As the content is being presented to the user by the device 102 via the presentation component 106 or communication device 108, the audio manager component 112 can control the respective volume levels of the respective audio signals of the content based at least in part on the initial mapping. The audio manager component 112 can monitor and analyze the volume levels of audio signals as the content is being processed and presented to the user via the presentation component 106 or communication device 108. Based at least in part on the analysis results, if the audio manager component 112 detects or identifies an audio signal in the content having a higher volume level than the initial highest volume level, the audio manager component 112 can use the higher volume level of the audio signal of the content as the highest volume level with regard to the mapping, and can adaptively modify the initial mapping to generate a new mapping based at least in part on the higher volume level of the audio signal of the content (e.g., the current highest volume level of the content), the set point, the upper threshold volume level, the lower threshold volume level, and/or the initial (e.g., estimated) lowest audible volume level, in accordance with the defined control criteria.

The audio manager component 112 can use the new adaptively modified mapping to control the respective volume levels of the respective audio signals of the content with regard to all or at least a portion of the content remaining to be presented. The audio manager component 112 can continue to adaptively modify the mapping to be used to adjust volume levels of audio signals of the remaining content as it is being presented, if another audio signal(s) is identified by the audio manager component 112 as being higher in volume than a current highest volume level that had been identified in the content.

In some implementations, if, while monitoring and analyzing the remaining content, the audio manager component 112 determines that no audio signals have had volume levels that are the same as or exceed the initial or a current highest volume level, for example, for a defined period of time (e.g., 5 minutes, 10 minutes, or other desired amount of time), the audio manager component 112 can identify the highest volume level over the defined period of time. The audio manager component 112 can adaptively modify the initial or current mapping (e.g., mapping used to adjust volume levels of audio signals of the remaining content as it is being presented) to generate a new mapping based at least in part on the highest volume level over the defined period of time and other desired factors (e.g.), in accordance with the defined control criteria. The "highest" volume level used for the new modified mapping can be the highest volume level over the defined period of time or another volume level that can be between the volume level used as the highest (or "highest") volume level in the previous mapping and the highest volume level over the defined period of time. For example, the audio manager component 112 can increment the highest (or "highest") volume level downward, but not all the way down to the highest volume level over the defined period of time, instead of decreasing the highest (or "highest") volume level all the way down to the highest volume level over the defined period of time.

In other implementations, in a similar manner to the adaptive modifications that can be made to a mapping in connection with changes identified for a highest or higher volume level of audio signals of the content, with regard to the initial lowest audible volume level or a current lowest audible volume level, the audio manager component 112 can adaptively modify an initial mapping or current mapping based at least in part on (e.g., in response to) detecting or identifying an audio signal having a lower audible volume level than the initial or current lowest audible volume level, in accordance with the defined control criteria, while monitoring or analyzing the content as it is being presented by the device 102 via the presentation component 106 or communication device 108.

The audio manager component 112 also can facilitate controlling volume levels of audio signals of content at different frequencies or in different frequency ranges. For example, the audio manager component 112 can set respective set points (e.g., a first set point, a second set point, . . . ), respective upper threshold volume levels (e.g., a first upper threshold volume level, a second upper threshold volume level, . . . ), and/or respective lower threshold volume levels (e.g., a first upper threshold volume level, a second upper threshold volume level, . . . ) for respective frequencies or in respective frequency ranges (e.g., a first frequency or first frequency range, a second frequency or second frequency range, . . . ). The audio manager component 112 can set the respective set points and respective threshold volume levels based at least in part on information received from a user selecting the respective set points and respective threshold volume levels and/or selections of set points and/or threshold volume levels made by the audio manager component 112 in accordance with the defined control criteria.

The audio manager component 112 can analyze audio signals of content at the respective frequencies or frequency ranges and can determine respective volume levels of respective audio signals of content at the respective frequencies or frequency ranges. The audio manager component 112 can determine respective adjusted volume levels for the respective audio signals at the respective frequencies or frequency ranges, and/or generate respective mappings or portions of a mapping that indicate or specify the respective adjusted volume levels for the respective audio signals at the respective frequencies or frequency ranges. The audio manager component 112 can adjust the volume levels of the respective audio signals to the respective adjusted volume levels at the respective frequencies or frequency ranges, in accordance with such mappings or portions of mappings.

Controlling volume levels of audio signals for different frequencies or frequency ranges (e.g., frequency bands) can provide a number of beneficial uses. For example, with regard to an action movie (or other type or sub-type of content), a user may desire to have volume levels of audio signals adjusted differently for different frequencies or different frequency ranges. The user may desire the volume levels of audio signals in a frequency range that human speech typically falls in to be adjusted differently than the volume levels of audio signals in another frequency range in which other audible sounds (e.g., explosions, gunfire, movie special effects, . . . ) fall, so that the user can more easily and clearly hear the dialog of characters in the movie (or other content), without the dialog being obscured by the other audible sounds in the movie (or other content) or without the other audible sounds being undesirably loud.

In certain implementations, as an alternative to or in addition to employing a set point and an upper and/or lower threshold volume level, the audio manager component 112 can employ an upper threshold volume level and/or a lower threshold volume level to clip volume levels of any audio signals of content that breach (e.g., exceed or are below) the upper threshold volume level and/or the lower threshold volume level to adjust those volume levels of those audio signals to respective volume levels that correspond to (e.g., match or substantially match) the upper threshold volume level and/or the lower threshold volume level, in accordance with the defined control criteria. The audio manager component 112 or the user can set or select an upper threshold volume level and/or a lower threshold volume level.

While in the clipping mode, the audio manager component 112 can analyze the audio signals of content being presented or to be presented to the user by the device 102 via the presentation component 106 or communication device 108. The audio manager component 112 can identify any audio signals having volume levels that breach (e.g., exceed or are below) the upper threshold volume level and/or the lower threshold volume level. In response, the audio manager component 112 can clip the volume levels of such audio signals to adjust those volume levels of those audio signals to respective volume levels that can correspond to (e.g., match or substantially match) the upper threshold volume level and/or the lower threshold volume level. With regard to the portion of audio signals of the content that do not breach the upper threshold volume level and/or the lower threshold volume level, the audio manager component 112 can allow the volume levels of those audio signals in the portion of audio signals of the content to remain at their respective volume levels for presentation by the device 102 via the presentation component 106 or communication device 108.

With regard to parameter settings (e.g., set point, threshold volume levels), if a user is not satisfied with particular parameter settings during presentation of the content by the device 102 via the presentation component 106 or communication device 108, the user can select different parameter settings via an interface on the device 102, presentation component 106, communication device 108, or remote control component 110, for example, while the content is being presented. In response, the audio manager component 112 can modify the parameter settings and/or modify the mapping accordingly, and can control volume levels of audio signals of the content based at least in part on the modified parameter settings and/or modified mapping.

The disclosed subject matter, by employing the audio manager component 112 to control volume levels of audio signals of content in accordance with the defined criteria, can provide a number of benefits that can enhance the presentation of content to users over conventional techniques. For example, the disclosed subject matter can facilitate controlling volume levels of audio signals of content without the user having manually adjust volume levels during presentation of the content. The disclosed subject matter can facilitate controlling volume levels of the audio signals of the content to enable a user to better hear sounds (e.g., dialog spoken in the content, including soft spoken or quieter dialog) the user desires to hear clearly during presentation of the content, without other audible sounds (e.g., relatively louder sounds) in the content being too loud and/or obscuring the sounds the user desires to hear clearly. The disclosed subject matter can facilitate smooth adjustment of volume levels of audio signals of the content across the volume spectrum (e.g., from lowest volume audible sounds to highest volume sounds) to desirably maintain the sound dynamics of the respective volume levels of different sounds relative to each other, while controlling volume levels of audio signals so that the loudest sounds are not undesirably loud and the quieter audible sounds are not too quiet (e.g., so as to be inaudible to the user).

Figure 5:
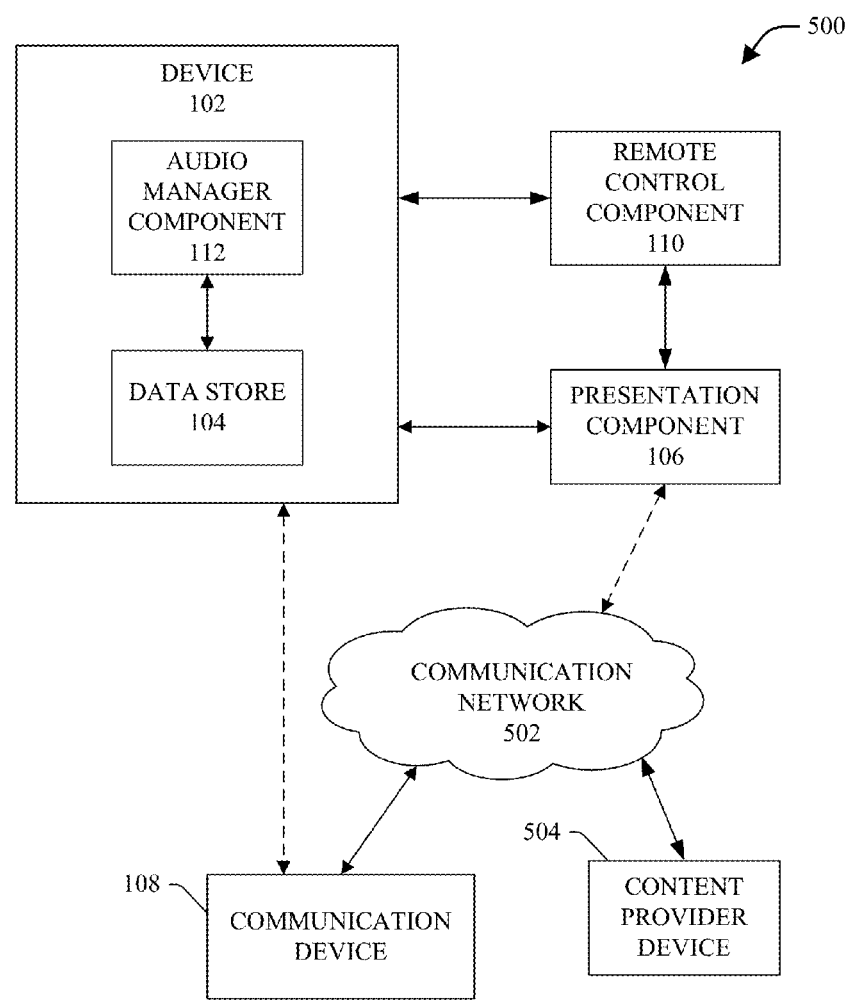
FIG. 5 presents a block diagram of another example system that can control volume levels of audio signals of content being presented via a device, in accordance with various aspects and embodiments of the disclosed subject matter.

Referring to FIG. 5, FIG. 5 presents a block diagram of another example system 500 that can control volume levels of audio signals of content being presented via a device, in accordance with various aspects and embodiments of the disclosed subject matter. The system 500 can comprise a device 102 (e.g., STB, STU, or other communication device) that can receive content (e.g., video or audio content) from one or more content sources, such as, for example, a content provider device associated with the device 102 (e.g., via a communication network).

The device 102 can be employed to record or store the content in a data store 104 of (or associated with) the device 102. The content can be stored in the data store 104, for example, for future presentation by the device 102 and a presentation component 106 (e.g., television, IPTV, or other display device) or other communication device 108 (e.g., mobile phone, computer, electronic pad or tablet, electronic eyewear, . . . ) associated with the device 102. The device 102 also can stream the content for presentation via the presentation component 106 or other communication device 108 associated with the device 102.

The presentation component 106 and/or the communication device 108 can be associated with (e.g., communicatively connected to) the device 102 via a wired or wireless communication connection. In some implementations, the presentation component 106 and/or communication device 108 can be associated with the device 102 via a communication network 502.

The communication network 502 can comprise a macro communication network and/or a micro communication network. The macro communication network can be, can comprise, or can be associated with a core network, a cellular network, an IP-based network, Wi-Fi, gigabit wireless (Gi-Fi) network, Hi-Fi network (e.g., providing higher gigabit data communication than Gi-Fi or Wi-Fi), Bluetooth, ZigBee, etc. The micro communication network can be associated with the macro communication network, wherein the micro communication network typically can operate in a defined local area (e.g., in or in proximity to a home, building, or other defined area). The micro communication network can be, can comprise, or can be associated with Wi-Fi, Gi-Fi, Hi-Fi, Bluetooth, ZigBee, etc., and/or can be associated with (e.g., connected to) the macro communication network. The micro communication network can be or can comprise, for example a local area network (LAN), that can facilitate connecting certain devices (e.g., communication devices) associated with the micro communication network to each other and/or to the macro communication network.

Respective communication devices (e.g., device 102, presentation component 106, communication device 108, content provider device 504, . . . ) can be associated with (e.g., communicatively connected to) the communication network 502 via a wireless communication connection or a wireline (e.g., wired) communication connection. The respective communication devices (e.g., 102, 106, 108, 504, . . . ) can operate and communicate in a communication network environment. At various times, a communication device (e.g., 102, 106, 108, and/or 504, . . . ) can be communicatively connected via a wireless communication connection(s) to one or more radio access networks (RANs) (not shown), which can comprise one or more base stations (not shown) to communicatively connect the communication device to the communication network 502 to enable the communication device to communicate other communication devices associated with (e.g., communicatively connected to) the communication network 502 in the communication network environment. The RANs can comprise, for example, a 3GPP universal mobile telecommunication system (UMTS) terrestrial RAN (UTRAN), an E-UTRAN (e.g., Long Term Evolution (LTE) RAN), a GSM RAN (GRAN), and/or other type of RAN(s) employing another type of communication technology.

The communication network 502 can comprise one or more wireline communication networks and one or more wireless communication networks, wherein the one or more wireless communication networks can be based at least in part on one or more various types of communication technology or protocols, such as, for example, 3G, 4G, 5G, or x generation (xG) network, where x can be virtually any desired integer or real value; Wi-Fi; Gi-Fi; Hi-Fi; etc. The communication network 502 (e.g., a core network, cellular network, or a network comprising a core network, cellular network, and/or an IP-based network) can facilitate routing voice and data communications between a communication device(s) (e.g., 106, 108, and/or 504, . . . ) and another communication device (e.g., the device 102) and/or other communication devices associated with the communication network 502 in the communication network environment. The communication network 502 also can allocate resources to the communication devices in the communication network 502, convert or enforce protocols, establish and enforce quality of service (QOS) for the communication devices, provide applications or services in the communication network 502, translate signals, and/or perform other desired functions to facilitate system interoperability and communication in the communication network 502 (e.g., wireless portion of the communication network 502 or wireline portion of the communication network 502). The communication network 502 further can comprise desired components, such as routers, nodes (e.g., general packet radio service (GPRS) nodes, such as serving GPRS support node (SGSN), gateway GPRS support node (GGSN)), switches, interfaces, controllers, etc., that can facilitate communication of data between communication devices in the communication network environment.

As a communication device(s) (e.g., communication device 108) is moved through a wireless communication network environment, at various times, the communication device(s) can be connected (e.g., wirelessly connected) to one of a plurality of access points (APs) (e.g., macro or cellular AP, femto AP, pico AP, wi-fi AP, wi-max AP, hotspot (e.g., hotspot 1.x, hotspot 2.x, where x is an integer number; communication device (e.g., communication device functioning as a mobile hotspot)) that can operate in the wireless communication network environment. An AP (e.g., base station) can serve a specified coverage area to facilitate communication by the communication device(s) (e.g., 108) or other communication devices in the wireless communication network environment. An AP can serve a respective coverage cell (e.g., macrocell, femtocell, picocell, etc.) that can cover a respective specified area, and the AP can service mobile wireless devices, such as the communication device(s) (e.g., 108) located in the respective area covered by the respective cell, where such coverage can be achieved via a wireless link (e.g., uplink (UL), downlink (DL)). When an attachment attempt is successful, the communication device(s) (e.g., 108) can be served by the AP and incoming voice and data traffic can be paged and routed to the communication device(s) (e.g., 108) through the AP, and outgoing voice and data traffic from the communication device(s) (e.g., 108) can be paged and routed through the AP to other communication devices in the communication network environment. In an aspect, the communication device(s) (e.g., 108) can be connected and can communicate wirelessly using virtually any desired wireless technology, including, for example, cellular, Wi-Fi; Gi-Fi; Hi-Fi; Wi-Max, Bluetooth, wireless local area networks (WLAN), etc.

One or more content provider devices, such as content provider device 504 can be associated with (e.g., communicatively connected to) the communication network 502. As desired, the content provider devices, such as content provider device 502, can be connected to the device 102, presentation component 106, or communication device 108 via the communication network 502. The respective content provider devices can be associated with respective content providers. The content provider devices, such as content provider device 504, can provide (e.g., communicate) content and/or other information (e.g., metadata, such as audio indicators) to the device 102 (or the presentation component 106 or the communication device 108) via the communication network 502. It is to be appreciated and understood that the device 102 (or the presentation component 106 or the communication device 108) also can receive content from another content provider device(s) via a direct wireline or wireless communication connection (e.g., communication channel) or other means without having to communicate the content via the communication network 502.

The content provider devices (e.g., 502) can be associated with, for example, a television-type device or system (e.g., terrestrial television channels, cable television system, satellite television system), one or more media (e.g., video, audio) streaming applications (e.g., YouTube, Hulu, Netflix, Pandora, . . . ) or web sites, one or more video-on-demand services, one or more pay-per-view services, a radio (e.g., terrestrial radio, satellite radio), or other media devices or applications (e.g., a computer, a smart phone, an electronic pad or tablet, an electronic gaming device, a compact disc (CD) player, a digital video disc (DVD) player, . . . ).

Figure 6:
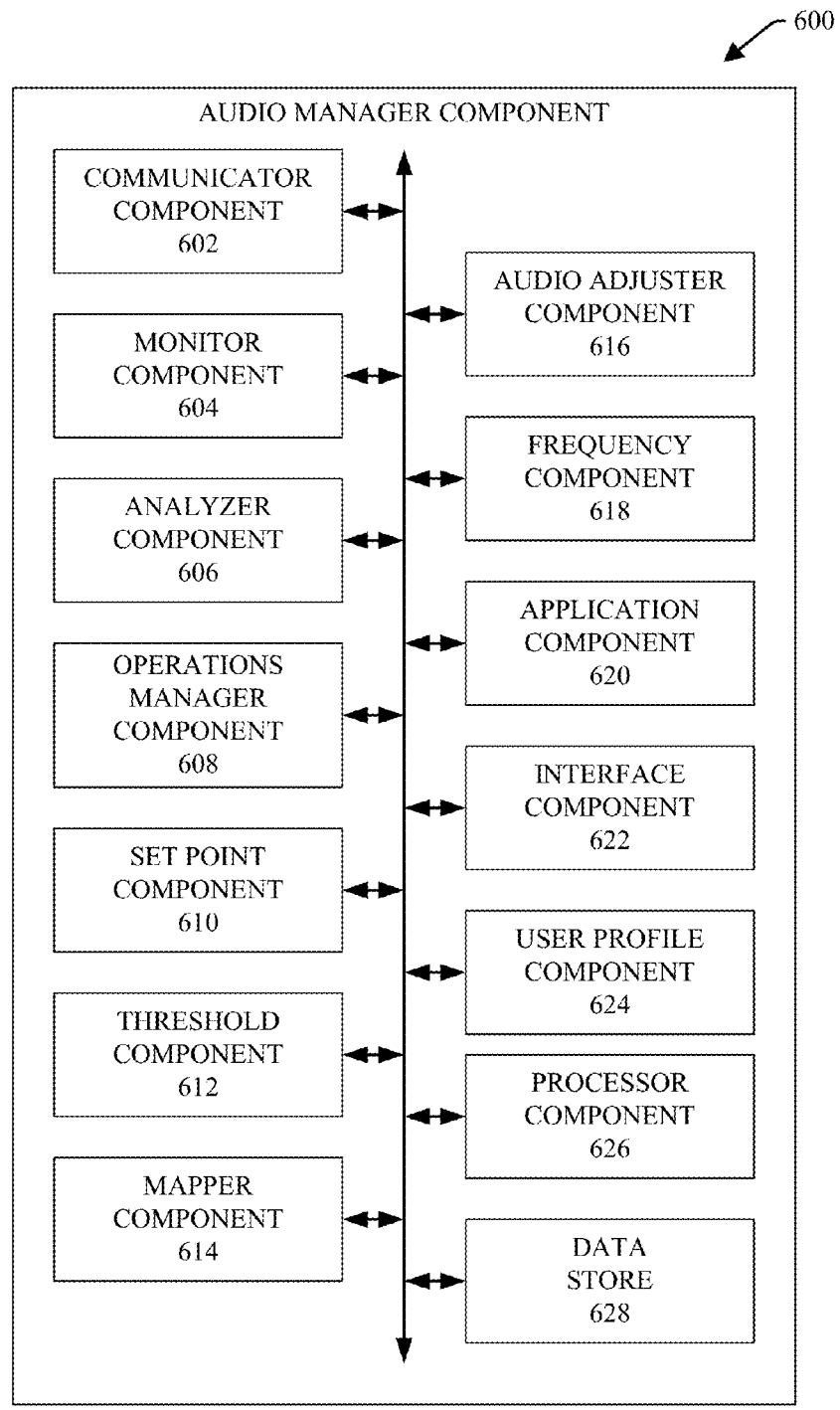
FIG. 6 depicts a block diagram of an example audio manager component, in accordance with various aspects and embodiments of the disclosed subject matter.

FIG. 6 depicts a block diagram of an example audio manager component 600, in accordance with various aspects and embodiments of the disclosed subject matter. In some implementations, the audio manager component 600 can be part of or associated with a device, such as a media device (e.g., an STB or STU).

The audio manager component 600 can comprise, for example, a communicator component 602, a monitor component 604, an analyzer component 606, an operations manager component 608, a set point component 610, a threshold component 612, a mapper component 614, an audio adjuster component 616, a frequency component 618, an application component 620, an interface component 622, and a user profile component 624.

The communicator component 602 can transmit information from the audio manager component 600 or associated media device to another component(s) or device(s) (e.g., presentation component, communication device) and/or can receive information from the other component(s) or device(s). For instance, the communicator component 602 can receive content from a content provider device, and transmit processed content (e.g., content comprising audio signals having adjusted volume levels), based at least in part on the received content, to a presentation component or other communication device associated with the device.

The monitor component 604 can monitor content being received by the device, audio indicators or other metadata being received by the device, volume levels of audio signals of content, information being received or selected by a user, and/or other information. For example, the monitor component 604 can facilitate detecting or identifying volume levels of audio signals of content being received or presented by the device.

The analyzer component 606 can analyze information, and can generate analysis results based at least in part on the results of the analysis. For example, the analyzer component 606 can analyze content and can determine respective volume levels of respective audio signals of the content based at least in part on the results of the analysis. As another example, the analyzer component 606 can analyze a volume level of an audio signal of content and a mapping (e.g., a mapping to facilitate controlling volume of audio signals) to facilitate determining a volume adjustment to make to the volume level of the audio signal.

The operations manager component 608 can control (e.g., manage) operations associated with the audio manager component 600. For example, the operations manager component 608 can facilitate generating instructions to have components of the audio manager component 600 perform operations, and can communicate respective instructions to respective components (e.g., communicator component 602, monitor component 604, analyzer component 606, . . . ) of the audio manager component 600 to facilitate performance of operations by the respective components of the audio manager component 600 based at least in part on the instructions, in accordance with the defined control criteria and defined control algorithms relating to controlling the volume levels of content. The operations manager component 608 also can facilitate controlling data flow between the respective components of the audio manager component 600 and controlling data flow between the audio manager component 600 and another component(s) or device(s) (e.g., communication device, presentation component, content provider device, remote control component, device of the communication network) associated with (e.g., connected to) the audio manager component 600.

The set point component 610 can be employed to provide information and/or receiving information (e.g., receiving selection of a set point from a user) relating to determining, recommending, setting, or modifying a set point (e.g., set point volume level) that can be used with regard to controlling volume levels of audio signals of content in connection with presentation of the content. The set point component 610 also can facilitate determining a desirable set point or range of set points that can be used, selected, or recommended to facilitate controlling volume levels of content based at least in part on the content, the type or sub-type of content, information (e.g., user preferences) in a user profile, volume levels of the audio signals of the content, and/or the defined control criteria.

The threshold component 612 can be utilized to provide information and/or receiving information (e.g., receiving selection of a threshold volume level from a user) relating to determining, recommending, setting, or modifying threshold volume levels, such as an upper threshold volume level and/or a lower threshold volume level, that can be used with regard to controlling volume levels of audio signals of content in connection with presentation of the content. The threshold component 612 also can facilitate determining one or more desirable threshold volume levels that can be used, selected, or recommended to facilitate controlling volume levels of content based at least in part on the content, the type or sub-type of content, information (e.g., user preferences) in a user profile, volume levels of the audio signals of the content, and/or the defined control criteria.

The mapper component 614 can generate a mapping based at least in part on a set point, one or more threshold volume levels (e.g., defined upper threshold volume level and/or defined lower threshold volume level), the content, the type or sub-type of content, information (e.g., user preferences) in a user profile, volume levels of the audio signals of the content, and/or the defined control criteria. The mapping can be used to facilitate controlling volume levels of audio signals of content in connection with presentation of the content. Mappings generated by the mapper component 614 can vary based at least in part on various factors, including, for example, variances in the set point, threshold volume levels, and/or volume levels of audio signals of content. A mapping, or a portion thereof, can be used to indicate respective amounts of volume adjustment at respective volume levels of audio signals of content and/or respective adjust volumes associated with the respective (original) volume levels of audio signals of content.

The audio adjuster component 616 can adjust respective volume levels of respective audio signals of content to desired respective adjusted volume levels to facilitate controlling the volume levels of audio signals of the content, in accordance with the defined control criteria. For instance, the audio adjuster component 616 can adjust the respective volume levels of the respective audio signals of the content to desired respective adjusted volume levels based at least in part on a mapping generated by the mapper component 614.

The frequency component 618 can facilitate controlling volume levels of audio signals of content at different frequencies or in different frequency ranges. For instance, the frequency component 618 can operate in conjunction with other components, such as the set point component 610, threshold component 612, and the mapper component 614, to facilitate determining respective volume levels of respective audio signals of content at respective frequencies or frequency ranges, determining respective adjusted volume levels for the respective audio signals at respective frequencies or frequency ranges, and/or generating respective mappings or portions of a mapping that indicate or specify the respective adjusted volume levels for the respective audio signals at respective frequencies or frequency ranges. The audio adjuster component 616 can adjust the volume levels of the respective audio signals to the respective adjusted volume levels at the respective frequencies or frequency ranges, in accordance with such mappings or portions of mappings.

The frequency component 618 can be employed to facilitate adjusting equalization levels at various frequencies or frequency ranges to desired equalization levels to facilitate shaping or contouring audio signals of content, as desired by the user. In some implementations, the frequency component 618 can facilitate providing equalization presets (e.g., equalization preset buttons) via an interface. An equalization preset can make a number of respective adjustments to respective equalization controls for individual frequencies or frequency ranges, in response to selection of the equalization preset by a user via an interface. A user can select a desired equalization preset via the interface to achieve a desired contouring of audio signals of content without having to manipulate individual equalization controls for individual frequencies or frequency ranges. There can be equalization presets based at least in part on type of content or sub-type of content. For example, there can be equalization presets for movies, types of movies (e.g., action, drama, comedy, suspense, . . . ), TV programs, types of TV programs (e.g., comedy, drama, talk show, news, . . . ), music, and/or types of music (e.g., rock, pop, country, electronic/dance, . . . ).

The application component 620 can be employed to generate, provide, and/or enable use of one or more applications (e.g., a volume control application, a content provider application, . . . ) that can be used by the device (e.g., STB or STU), presentation component (e.g., TV, IPTV), a communication device (e.g., mobile phone, electronic pad or tablet, computer, . . . ), and/or remote control component to facilitate utilizing components (e.g., components of the audio manager component 600) and services associated with controlling volume levels of audio signals of content being presented by the device. For example, a user can use a communication device to download an application from the application component 620 to the communication device or can otherwise obtain and/or access the application (directly or indirectly) from the application component 620. The application can operate in conjunction with the components of the audio manager component 600, the device, or other components or devices to facilitate enabling the user to utilize the components and services associated with controlling volume levels of audio signals of content being presented by the device. The user can use the application associated with the communication device to facilitate viewing and setting set points, viewing and setting threshold volume levels, viewing and setting equalization levels at various frequencies or frequency ranges, monitoring volume levels or adjusted volume levels, controlling volume levels of content, and/or accessing content or controlling presentation of the content, etc.

The application component 620 also can generate, provide, and/or enable use of a content provider application (e.g., Pandora application, YouTube application, Hulu application, Netflix application, . . . ). A content provider application can be used to facilitate providing content from a content provider (e.g., a server device of the content provider) to the device, presentation component, and/or communication device of the user for presentation of the content via the presentation component or communication device of the user.

The interface component 622 can generate and facilitate presenting, for example, via the device, a presentation component, a communication device, or a remote control component, various interface screens, buttons, controls, menus, data fields, etc., that can be employed to facilitate controlling volume levels of audio signals of content being presented, including enabling a user to manipulate controls or buttons, and make parameter selections (e.g., set point, threshold volume levels, equalization parameters), to facilitate controlling or tailoring the volume levels and other sound characteristics of audio signals of content being presented, as desired by the user.

For example, the interface component 622 can generate and facilitate presenting an interface screen that can include various data fields, including data fields relating to set points and/or threshold volume levels, in which a user can enter or select desired parameter values associated with the respective data fields. The interface screen also can facilitate presenting one or more menus with various set point values and/or threshold volume values. In some implementations, the interface component 622 can generate and facilitate presenting, via that interface screen or another interface screen, buttons (e.g., presets) that a user can manipulate to select and set preset set points and/or threshold volume levels, wherein the presets can be based at least in part on type of content and/or sub-type of content, as more fully disclosed herein.

The interface component 622 also can generate and facilitate presenting an interface screen that can include a mapping that can facilitate controlling volume levels of audio signals of content, wherein the mapping can include a set point(s), a threshold volume level(s), and a mapping curve that can be based at least in part on the set point(s) and threshold volume level(s). A user can interact with the interface screen to manipulate buttons associated with a set point and threshold volume levels to adjust the set point and threshold volume levels, and correspondingly the mapping curve, as desired by the user.

The user profile component 624 can facilitate generating one or more user profiles associated with one or more users. The user profile component 624 can facilitate storing information, such as user preferences relating to controlling volume levels of audio signals of content or other sound characteristics (e.g., equalization parameters) of the audio signals, as desired by a user, in the user profile of the user. The user preferences can comprise a desired set point value(s), desired threshold volume levels, desired equalization parameters, and/or desired preset values with respect to the user.

The audio manager component 600 can comprise a processor component 626 that can work in conjunction with the other components (e.g., communicator component 602, monitor component 604, analyzer component 606, operations manager component 608, set point component 610, threshold component 612, mapper component 614, audio adjuster component 616, frequency component 618, application component 620, interface component 622, user profile component 624, data store 628) to facilitate performing the various functions of the audio manager component 600. The processor component 626 can employ one or more processors, microprocessors, or controllers that can process data, such as information relating to users, user preferences, controlling or adjusting volume levels of audio signals of content, interpolating volume levels, set point volume levels, threshold volume levels, equalization parameters, mappings, preset parameter values, traffic flows, policies, defined control criteria, algorithms (e.g., defined control algorithm), protocols, interfaces, tools, and/or other information, to facilitate operation of the audio manager component 600, as more fully disclosed herein, and control data flow between the audio manager component 600 and other components (e.g., communication devices, presentation component, content provider devices, remote control component, devices of the communication network, data sources, applications) associated with the audio manager component 600.

The audio manager component 600 also can include a data store 628 that can store data structures (e.g., user data, metadata), code structure(s) (e.g., modules, objects, hashes, classes, procedures) or instructions, information relating to users, user preferences, users, user preferences, controlling or adjusting volume levels of audio signals of content, interpolating volume levels, set point volume levels, threshold volume levels, equalization parameters, mappings, preset parameter values, traffic flows, policies, defined control criteria, algorithms (e.g., defined control algorithm), protocols, interfaces, tools, and/or other information, to facilitate controlling operations associated with the audio manager component 600. In an aspect, the processor component 626 can be functionally coupled (e.g., through a memory bus) to the data store 628 in order to store and retrieve information desired to operate and/or confer functionality, at least in part, to the communicator component 602, monitor component 604, analyzer component 606, operations manager component 608, set point component 610, threshold component 612, mapper component 614, audio adjuster component 616, frequency component 618, application component 620, interface component 622, user profile component 624, data store 628, etc., and/or substantially any other operational aspects of the audio manager component 600.

It is to be appreciated and understood that authentication protocols and techniques can be employed to facilitate security of data (e.g., content, user profiles, . . . ) associated with a device (e.g., STB or STU), a communication device, memory, or other devices, in accordance with the disclosed subject matter. For instance, an authenticator component can employ authentication protocols to facilitate security and integrity of the device (or communication device or application), including operation of the device (or communication device or application) and functions associated with the device (or communication device or application), data associated with the device (or communication device or application), such as, e.g., communicated data, data stored in a data store of or associated with the device (or communication device or application), in accordance with the disclosed subject matter. For example, the authenticator component can solicit authentication data (e.g., an authentication credential) from an entity (e.g., a user, another device), and, upon receiving the authentication data so solicited, can be employed, individually and/or in conjunction with information acquired and ascertained as a result of biometric modalities employed, to facilitate control access to the device (or communication device or application), access and control of certain functions associated with the device (or communication device or application), access to data associated with the device (or communication device or application), etc. The authentication data can be in the form of a password (e.g., a sequence of humanly cognizable characters), a pass phrase (e.g., a sequence of alphanumeric characters that can be similar to a typical password but is conventionally of greater length and contains non-humanly cognizable characters in addition to humanly cognizable characters), a pass code (e.g., Personal Identification Number (PIN)), and the like, for example. Additionally and/or alternatively, public key infrastructure (PKI) data can also be employed by the authenticator component. PKI arrangements can provide for trusted third parties to vet, and affirm, entity identity through the use of public keys that typically can be certificates issued by the trusted third parties. Such arrangements can enable entities to be authenticated to each other, and to use information in certificates (e.g., public keys) and private keys, session keys, Traffic Encryption Keys (TEKs), cryptographic-system-specific keys, and/or other keys, to encrypt and decrypt messages communicated between entities.

The authenticator component can implement one or more machine-implemented techniques to identify an entity (e.g., user, communication device) by its unique physical and behavioral characteristics and attributes. Biometric modalities that can be employed can include, for example, finger print identification that can scan the corrugated ridges of skin that are non-continuous and form a pattern that can provide distinguishing features to identify an entity, face recognition wherein measurements of key points on an entity's face can provide a unique pattern that can be associated with the entity, and iris recognition that measures from the outer edge towards the pupil the patterns associated with the colored part of the eye—the iris—to detect unique features associated with an entity's iris.

In response to verifying that the received authentication data matches stored authentication data relating to the entity, the authenticator component can grant a subset of access and control rights to allow the entity (e.g., user and/or an associated communication device) access to the device (or communication device or application), access and control of certain functions associated with the device (or communication device or application), and/or access to data associated with the device (or communication device or application), etc., in accordance with access and control rights that the entity is permitted to have. In response to not being able to verify that the received authentication data matches stored authentication data relating to the entity, the authenticator component can deny the entity access and control rights to access to the device (or communication device or application), access and control of certain functions associated with the device (or communication device or application), and/or access to data associated with the device (or communication device or application), etc., or can grant limited access and control rights to the entity, wherein the limited access rights can be access and control rights that are permitted to be granted to non- or un-authorized entities. The authenticator component also can provide an entity with one or more additional opportunities to provide valid authentication data up to a defined maximum number of authentication attempts.

It is also to be understood and appreciated that cryptographic protocols can be employed to facilitate security of data associated with a memory (e.g., data store) in accordance with the disclosed subject matter. For example, a cryptographic component (e.g., cryptographic engine) can be employed and can facilitate encrypting and/or decrypting data (e.g., content, content schedule, user-related information) to facilitate securing data being written to, stored in, and/or read from memory (e.g., data store). The cryptographic component can provide symmetric cryptographic tools and accelerators (e.g., Twofish, Blowfish, AES, TDES, IDEA, CAST5, RC4, etc.) to ensure that the memory, or at least a specified partition in the memory component, or portions thereof, can only be accessed by those entities authorized and/or authenticated to do so. The cryptographic component can also provide asymmetric cryptographic accelerators and tools (e.g., RSA, Digital Signature Standard (DSS), and the like) to ensure that a specified partition in a memory, or portions thereof, only can be accessed by those entities that are authorized and certified to do so. Additionally, the cryptographic component can provide accelerators and tools (e.g., Secure Hash Algorithm (SHA) and its variants such as, for example, SHA-0, SHA-1, SHA-224, SHA-256, SHA-384, and SHA-512) to ensure that access to the specified partition in the memory is confined to those entities authorized to gain access.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

In view of the example systems and/or devices described herein, example methods that can be implemented in accordance with the disclosed subject matter can be further appreciated with reference to flowcharts in FIGS. 7-11. For purposes of simplicity of explanation, example methods disclosed herein are presented and described as a series of acts; however, it is to be understood and appreciated that the disclosed subject matter is not limited by the order of acts, as some acts may occur in different orders and/or concurrently with other acts from that shown and described herein. For example, a method disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a method in accordance with the subject specification. It should be further appreciated that the methods disclosed throughout the subject specification are capable of being stored on an article of manufacture to facilitate transporting and transferring such methods to computers for execution by a processor or for storage in a memory.

Figure 7:
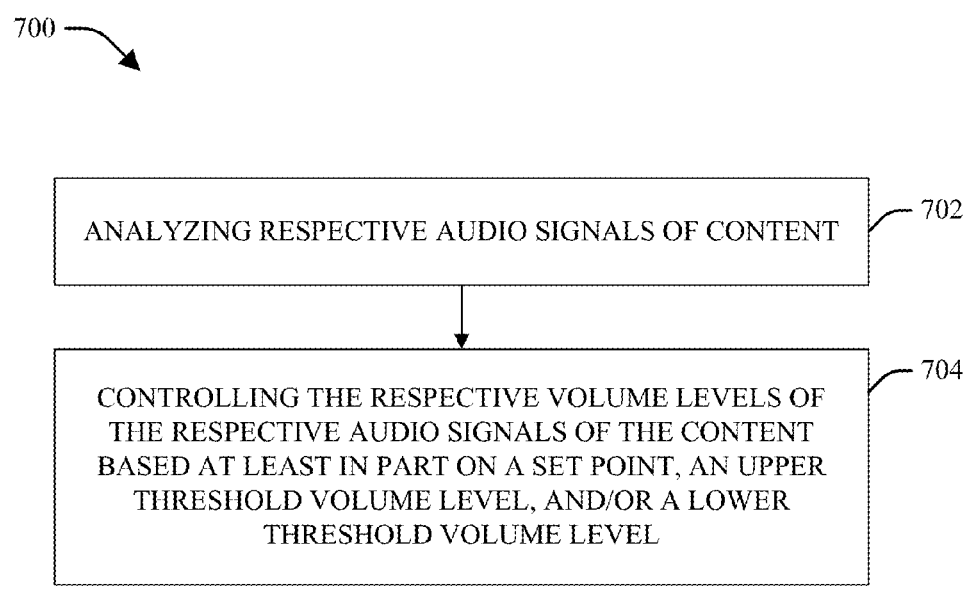
FIG. 7 illustrates a flow diagram of an example method that can control volume levels of audio signals of content being presented by a device, in accordance with various aspects and embodiments of the disclosed subject matter.

FIG. 7 illustrates a flow chart of an example method 700 that can control volume levels of audio signals of content being presented by a device, in accordance with various aspects and embodiments of the disclosed subject matter. The method 700 can be employed by, for example, an audio manager component of or associated with the device.

At 702, respective audio signals of content can be analyzed. The audio manager component can analyze the respective audio signals of the content that was received from or is being streamed from a content provider device to facilitate determining respective volume levels of the respective audio signals of the content.

To facilitate controlling volume levels of the audio signals, a set point (e.g., a set point volume level) can be set, wherein the set point can be a preconfigured or default value set by the audio manager component or can be a value selected by a user via the device or a communication device (e.g., mobile phone, computer, electronic pad or tablet, remote control, . . . ) associated with (e.g., communicatively connected to) the device. In some implementations, the audio manager component can determine and set the upper threshold volume level and lower threshold volume level based at least in part on the set point. In other implementations, the user can use the device or the associated communication device to select the upper threshold volume level and/or the lower threshold volume level.

In connection with the analysis, the audio manager component can generate a mapping that can map a high(er) volume audio signal(s) and/or a low(er) volume audio signal(s) to a defined volume range around the set point based at least in part on the upper and/or lower threshold volume levels. The mapping can be employed to facilitate reducing volume levels of higher volume audio signals of the content that are above the set point and/or the upper threshold volume level, and/or increasing volume levels of lower volume audio signals of the content that are below the set point and/or the lower threshold volume level. As part of the analysis, the audio manager component can analyze the respective audio signals based at least in part on the mapping.

At 704, the respective volume levels of the respective audio signals of the content can be controlled based at least in part on a set point, an upper threshold volume level, and/or a lower threshold volume level. The audio manager component can control (e.g., adjust, modify) the respective volume levels of the respective audio signals of the content based at least in part on the set point, upper threshold volume level, and/or lower threshold volume level. For example, the audio manager component can adjust the respective volume levels of the respective audio signals of the content based at least in part on the mapping.

Figure 8:
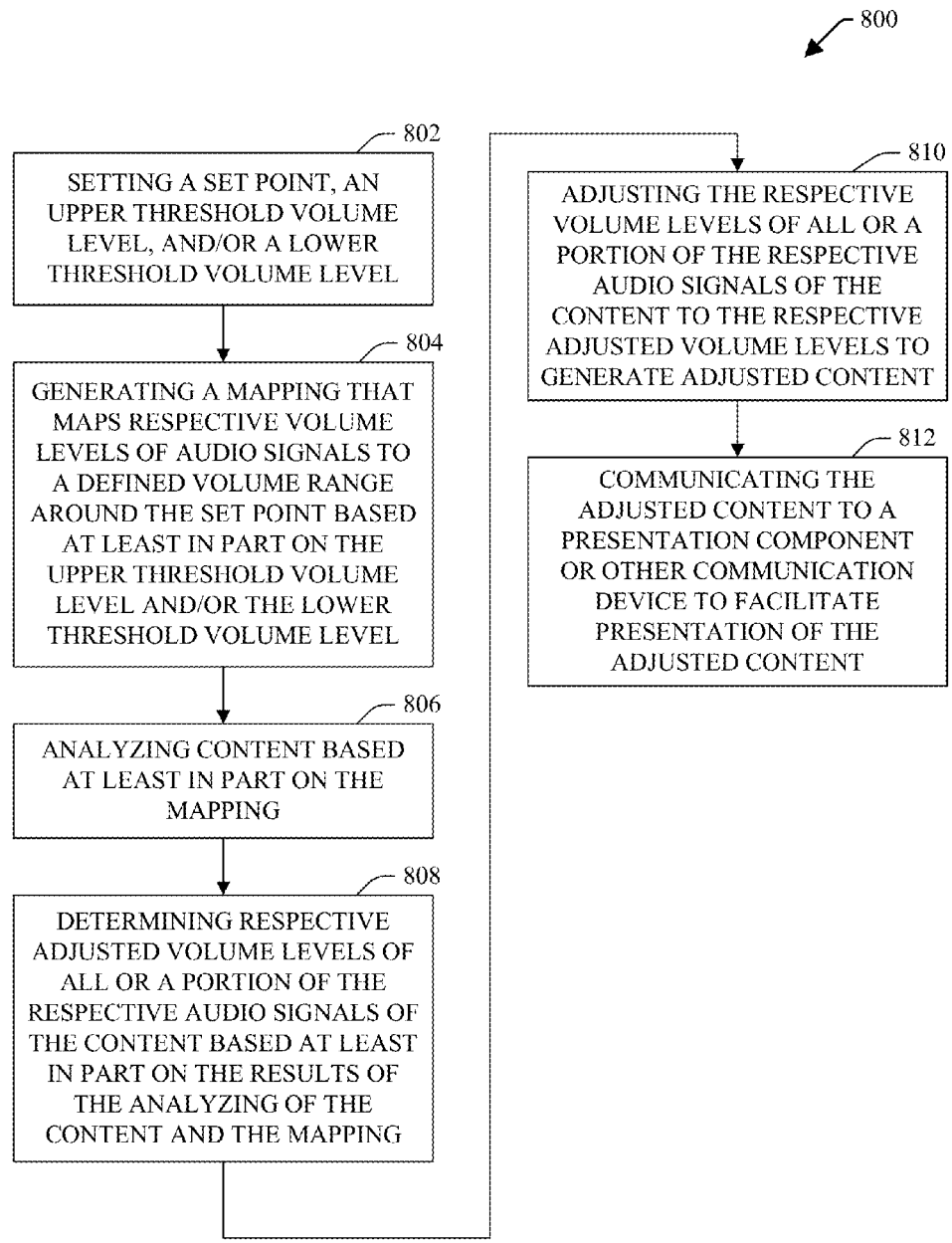
FIG. 8 presents a flow chart of another example method that can control volume levels of audio signals of content being presented by a device, in accordance with various aspects and embodiments of the disclosed subject matter.

FIG. 8 presents a flow chart of another example method 800 that can control volume levels of audio signals of content being presented by a device, in accordance with various aspects and embodiments of the disclosed subject matter. The method 800 can be employed by, for example, an audio manager component of or associated with the device.

At 802, a set point, an upper threshold volume level, and/or a lower threshold volume level can be set. The audio manager component can set the set point to a value selected by a user via the device or a communication device associated with the device, or to a default value. The audio manager component also can determine and/or set the upper threshold volume level and/or the lower threshold volume level to respective values based at least in part on the set point or the selection of thresholds received from the user via the device or communication device.

At 804, a mapping can be generated to map respective volume levels of audio signals to a defined volume range around (e.g., above and/or below) the set point based at least in part on the upper threshold volume level and/or the lower threshold volume level. The audio manager component can generate the mapping to map the respective volume levels of audio signals to the defined volume range around the set point based at least in part on the upper threshold volume level and/or the lower threshold volume level. The defined volume range can be based at least in part on the upper threshold volume level and/or the lower threshold volume level. In some implementations, the mapping can map a high(er) volume audio signal(s) and/or a low(er) volume audio signal(s) to the defined volume range around the set point based at least in part on the upper and/or lower threshold volume levels.

At 806, content can be analyzed based at least in part on the mapping. The device can receive or stream audio content for presentation by a presentation component (e.g., television, IPTV) or other communication device associated with the device. In some instances, the device can receive the content and store the content in a data store of or associated with the device for future viewing by the user. In other instances, the device can stream (and/or store) the received content to the presentation component or other communication device.

The audio manager component can monitor the content, and can analyze the content based at least in part on the mapping. For instance, the audio manager component can analyze the respective audio signals of the content to determining respective volume levels of the respective volume signals. The audio manager component can apply the mapping to the respective audio signals of the content to facilitate determining adjustments to be made to the respective volume levels of all or a portion of the respective audio signals of the content.

At 808, respective adjusted volume levels of all or a portion of the respective audio signals of the content can be determined based at least in part on the results of the analyzing of the content and the mapping. The audio manager component can determine the respective adjusted volume levels of all or a portion of the respective audio signals of the content based at least in part on the analysis results and the mapping.

With regard to a particular audio signal of the content, the audio manager component can interpolate or determine a particular volume level that the particular audio signal is to be adjusted to from its current volume level, in accordance with the mapping. The particular audio signal can be one that has a volume level that is higher than the upper threshold volume level or that has a volume level that is above the set point, but below the upper threshold volume level; or the particular audio signal can be one that has a volume level that is lower than the lower threshold volume level or that has a volume level that is below the set point, but above the lower threshold volume level.

The amount and type of adjustment to the volume level of the particular audio signal can vary based at least in part on the current volume level of the particular audio signal in relation to the mapping (e.g., in relation to the characteristics (e.g., curve) of the mapping, the set point volume level, the upper threshold volume level, and the lower threshold volume level). For example, if a first audio signal of the content has a first volume level that is higher than the upper threshold volume level, the audio manager component can determine a first volume adjustment that is to be made to the first volume level to lower the volume level of the first audio signal to a first adjusted volume level that is at or below the upper threshold volume level. If a second audio signal of the content has a second volume level that is higher than the set point, but lower than the upper threshold volume level, the audio manager component can determine a second volume adjustment that is to be made to the second volume level to lower the volume level of the second audio signal to a second adjusted volume level that is below (e.g., further below) the upper threshold volume level (e.g., than the second audio signal), wherein the amount of volume adjustment of the first volume adjustment can be greater than the second volume adjustment.

Further to the example, if a third audio signal of the content has a third volume level that is lower than the lower threshold volume level, the audio manager component can determine a third volume adjustment that is to be made to the third volume level to increase the volume level of the third audio signal to a third adjusted volume level that is at or above the lower threshold volume level. If a fourth audio signal of the content has a fourth volume level that is lower than the set point, but higher than the lower threshold volume level, the audio manager component can determine a fourth volume adjustment that is to be made to the fourth volume level to increase the volume level of the fourth audio signal to a fourth adjusted volume level that is above (e.g., further above) the lower threshold volume level (e.g., than the fourth audio signal), wherein the amount of volume adjustment of the third volume adjustment can be greater than the fourth volume adjustment.

At 810, the respective volume levels of all or a portion of the respective audio signals of the content can be adjusted to the respective adjusted volume levels to generate adjusted content. The audio manager component can adjust the respective volume levels of all or a portion of the respective audio signals of the content to the respective adjusted volume levels to generate the adjusted content (e.g., volume-adjusted content).

At 812, the adjusted content can be communicated to a presentation component or other communication device to facilitate presentation of the adjusted content. The audio manager component can communicate the adjusted content to the presentation component or other communication device. The presentation component or other communication device can receive the adjusted content and present the adjusted content to the user(s).

Figure 9:
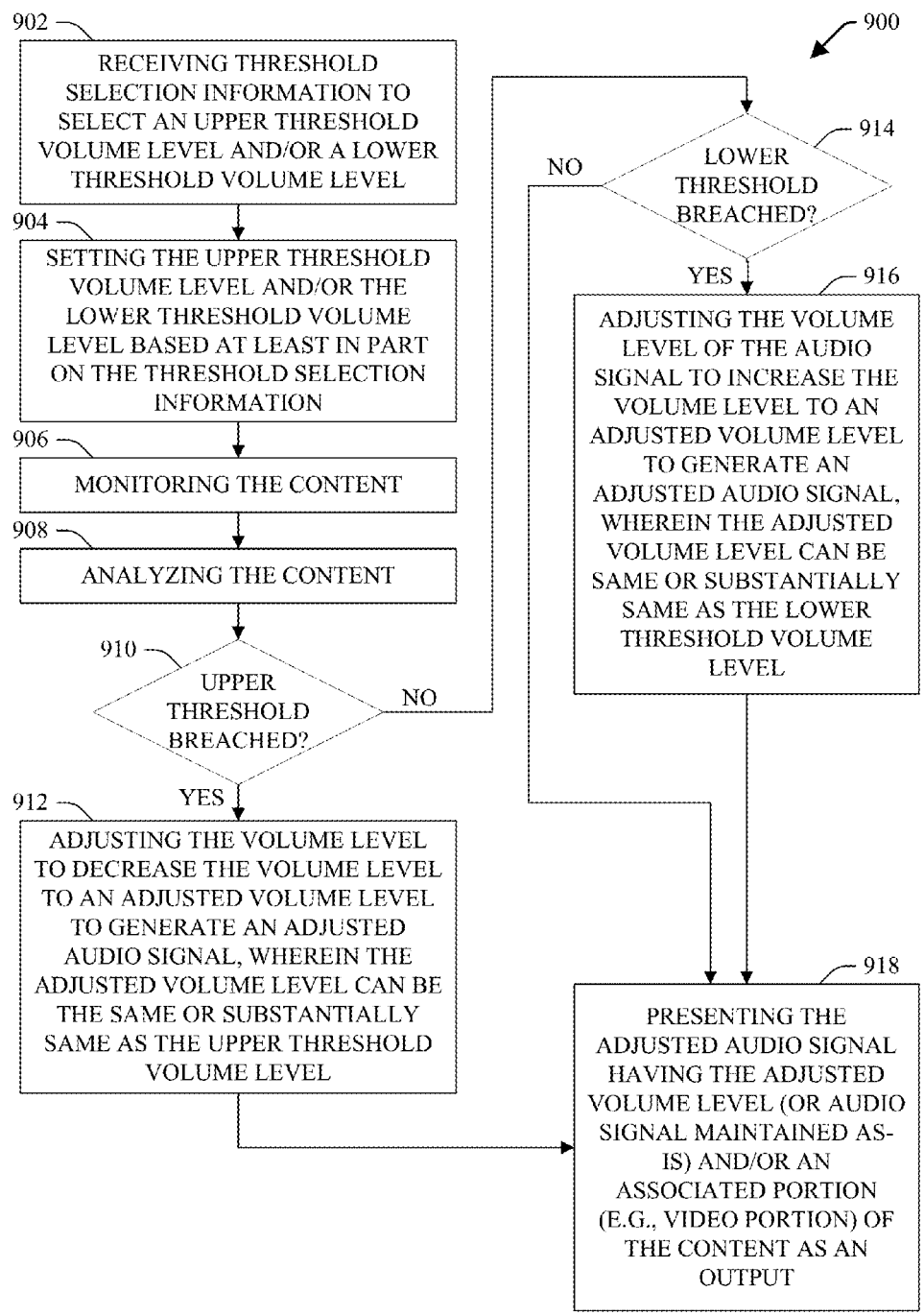
FIG. 9 depicts a flow chart of an example method that can clip the volume of certain audio signals of content to facilitate controlling volume levels of audio signals of content being presented by a device, in accordance with various aspects and embodiments of the disclosed subject matter.

FIG. 9 depicts a flow chart of an example method 900 that can clip the volume of certain audio signals of content to facilitate controlling volume levels of audio signals of content being presented by a device, in accordance with various aspects and embodiments of the disclosed subject matter. The method 900 can be employed by, for example, an audio manager component of or associated with the device.

At 902, threshold selection information to select an upper threshold volume level and/or a lower threshold volume level can be received. The audio manager component of the device can receive the threshold selection information from the user via an interface on the device or a communication device (e.g., mobile phone, computer, remote control, . . . ) associated with the device.

At 904, the upper threshold volume level and/or the lower threshold volume level can be set based at least in part on the threshold selection information. In response to receiving the threshold selection information, the audio manager component can set the upper threshold volume level and/or the lower threshold volume level.

At 906, content can be monitored. The audio manager component can monitor the content, which can be received, for example, from a content provider device. The content can be streaming content or content previously received and stored in a data store on the device or associated with the device.

At 908, the content can be analyzed. The audio manager component can analyze respective audio signals of the content to determine or identify respective volume levels of the respective audio signals.

At 910, with regard to each audio signal of the content, a determination can be made regarding whether the audio signal has breached the upper threshold volume level. The audio manager component can compare the volume level of the audio signal to the upper threshold volume level to determine whether the volume level of the audio signal has breached (e.g., exceeded) the upper threshold volume level.

If, at 910, it is determined that the volume level of the audio signal has breached the upper threshold volume level, at 912, the volume level can be adjusted to decrease the volume level to an adjusted volume level to generate an adjusted audio signal, wherein the adjusted volume level can be the same as, or substantially the same as, the upper threshold volume level. If, based at least in part on the result of the comparison, the audio manager component determines that the volume level of the audio signal has breached the upper threshold volume level, the audio manager component can adjust the volume level of the audio signal to decrease it to an adjusted volume level that can be the same as, or substantially the same as, the upper threshold volume level.

At this point, from reference numeral 912, the method 900 can proceed to reference numeral 918, wherein the adjusted audio signal having the adjusted volume level and/or an associated portion (e.g., video portion) of the content can be presented as an output. The audio manager component can present (e.g., communicate) the adjusted audio signal and/or the associated portion of the content as an output, for example, to a presentation component or other communication device for presentation.

With further regard to reference numeral 910, if, however, at 910, it is determined that the volume level of the audio signal has not breached the upper threshold volume level, the method 900 can proceed to reference numeral 914. At 914, a determination can be made regarding whether the audio signal has breached the lower threshold volume level. The audio manager component can compare the volume level of the audio signal to the lower threshold volume level to determine whether the volume level of the audio signal has breached (e.g., is lower than) the lower threshold volume level.

If, at 914, it is determined that the volume level of the audio signal has breached the lower threshold volume level, at 916, the volume level of the audio signal can be adjusted to increase the volume level to an adjusted volume level to generate an adjusted audio signal, wherein the adjusted volume level can be the same as, or substantially the same as, the lower threshold volume level. If, based at least in part on the result of the comparison performed in connection with the operation at 914, the audio manager component determines that the volume level of the audio signal has breached the lower threshold volume level, the audio manager component can adjust the volume level of the audio signal to increase it to the adjusted volume level that can be the same as, or substantially the same as, the lower threshold volume level.

At this point, from reference numeral 914, the method 900 can proceed to reference numeral 918, wherein the adjusted audio signal having the adjusted volume level and/or an associated portion (e.g., video portion) of the content can be presented as an output. The audio manager component can present (e.g., communicate) the adjusted audio signal and/or the associated portion of the content as an output, for example, to the presentation component or other communication device for presentation.

With further regard to reference numeral 914, if, however, at 914, it is determined that the volume level of the audio signal has not breached the lower threshold volume level, the method 900 can proceed to reference numeral 918. At 918, the audio signal (e.g., audio signal with no volume adjustment) can be presented as an output. In response to determining that the volume level of the audio signal has not breached the lower threshold volume level (and upper threshold volume level), the audio manager component can determine that no volume adjustment is to be made to the audio signal, and can present (e.g., communicate) the audio signal and/or the associated portion of the content as an output, for example, to the presentation component or other communication device for presentation.

Figure 10:
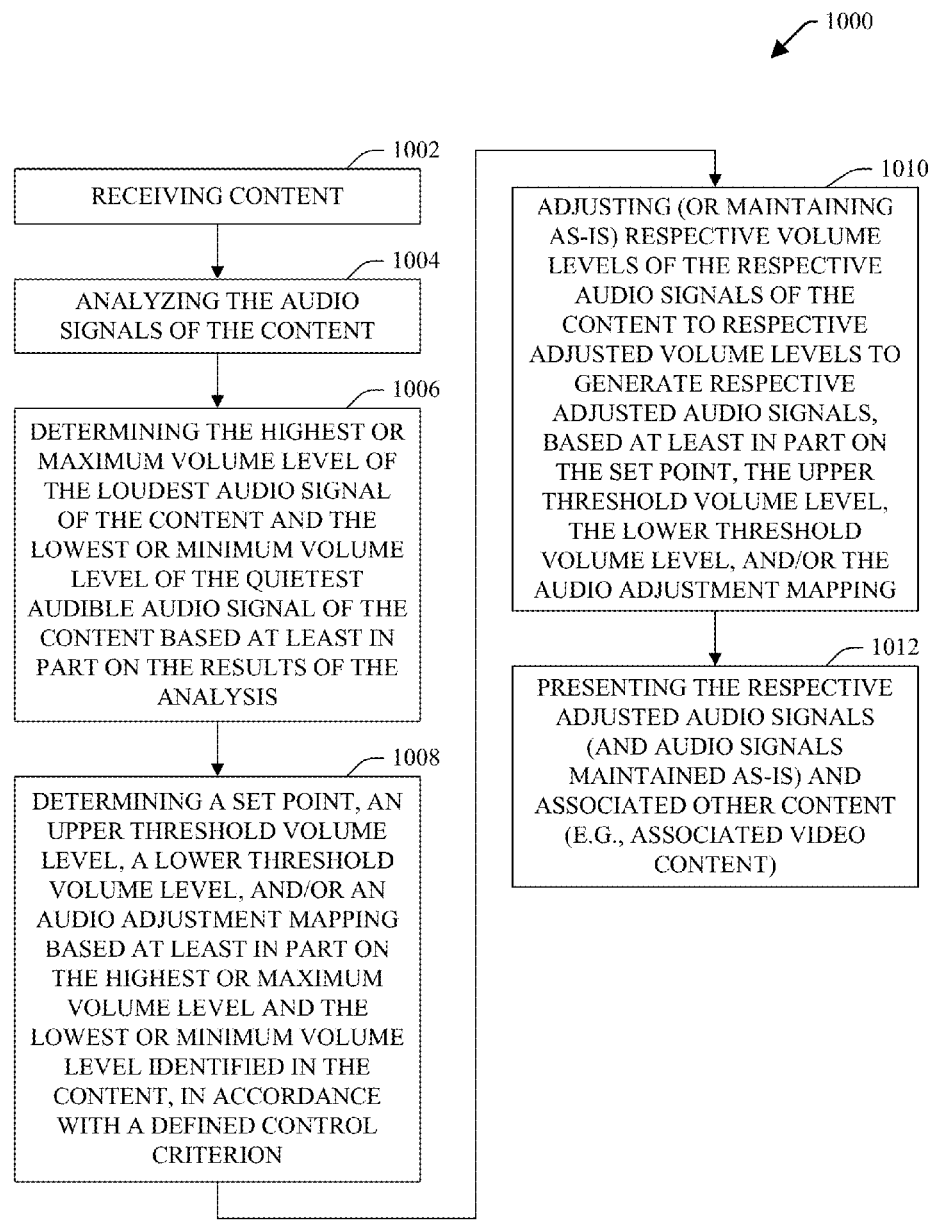
FIG. 10 illustrates a flow chart of an example method that can determine maximum and minimum audio signals in content to facilitate controlling volume levels of audio signals of the content being presented by a device, in accordance with various aspects and embodiments of the disclosed subject matter.

FIG. 10 illustrates a flow chart of an example method 1000 that can determine maximum and minimum audio signals in content to facilitate controlling volume levels of audio signals of the content being presented by a device, in accordance with various aspects and embodiments of the disclosed subject matter. The method 1000 can be employed by, for example, an audio manager component of or associated with the device.

At 1002, content can be received. The audio manager component can receive the content from a content provider device associated with a content provider.

At 1004, the audio signals of the content can be analyzed. The audio manager component can analyze the audio signals of the content to facilitate determining or identifying a loudest audio signal and a quietest audible audio signal of the content.

At 1006, the highest or maximum volume level of the loudest audio signal of the content and the lowest or minimum volume level of the quietest audible audio signal of the content can be determined based at least in part on the results of the analysis. The audio manager component can respectively determine or identify the highest or maximum volume level of the loudest audio signal of the content and the lowest or minimum volume level of the quietest audible audio signal of the content.

At 1008, a set point, an upper threshold volume level, a lower threshold volume level, and/or an audio adjustment mapping can be determined based at least in part on the highest or maximum volume level and the lowest or minimum volume level identified in the content, in accordance with a defined control criterion. The audio manager component can determine the set point, the upper threshold volume level, the lower threshold volume level, and/or the audio adjustment mapping to use to control the volume levels of the audio signals of the content, based at least in part on the highest or maximum volume level and the lowest or minimum volume level identified in the content, in accordance with a defined control criterion.

At 1010, to facilitate controlling volume levels of respective audio signals of the content, respective volume levels of the respective audio signals of the content can be adjusted (or maintained as-is) to respective adjusted volume levels to generate respective adjusted audio signals, based at least in part on the set point, the upper threshold volume level, the lower threshold volume level, and/or the audio adjustment mapping. The audio manager component can adjust (or maintain as-is) the respective volume levels of the respective audio signals of the content to the respective adjusted volume levels, based at least in part on the set point, the upper threshold volume level, the lower threshold volume level, and/or the audio adjustment mapping.

At 1012, the respective adjusted audio signals (and audio signals maintained as-is) and associated other content (e.g., associated video content) can be presented. The audio manager component can present (e.g., communicate) the respective adjusted audio signals (and audio signals maintained as-is) and associated other content to a presentation component or other communication device for presentation to the user(s).

Figure 11:
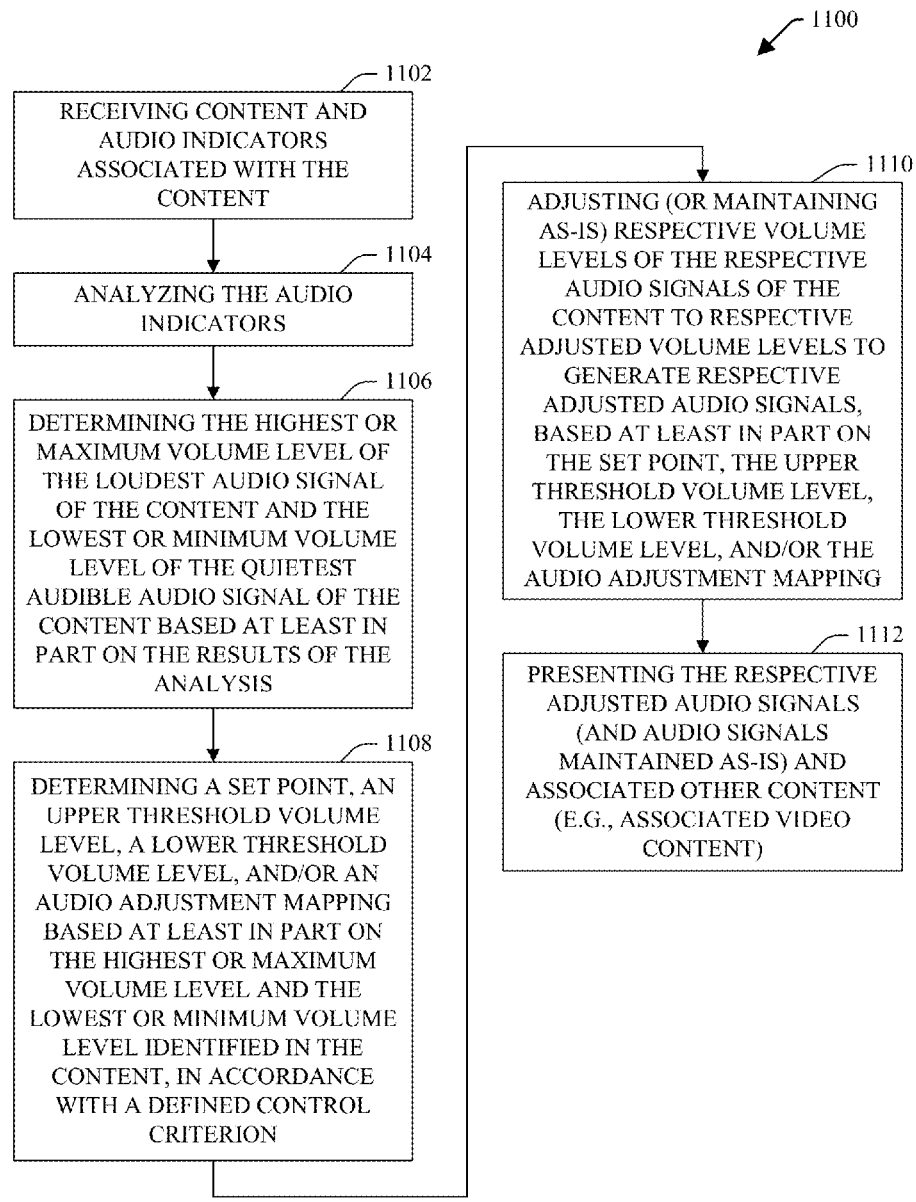
FIG. 11 depicts a flow chart of an example method that can employ audio indicators associated with content to facilitate controlling volume levels of audio signals of the content being presented by a device, in accordance with various aspects and embodiments of the disclosed subject matter.

FIG. 11 depicts a flow chart of an example method 1100 that can employ audio indicators associated with content to facilitate controlling volume levels of audio signals of the content being presented by a device, in accordance with various aspects and embodiments of the disclosed subject matter. The method 1100 can be employed by, for example, an audio manager component of or associated with the device.

At 1102, content and audio indicators associated with the content can be received. The audio manager component can receive the content and metadata, such as the audio indicators, from a content provider device. The audio indicators can comprise, for example, a highest or maximum audio indicator, a lowest or minimum audio indicator. The highest or maximum audio indicator can indicate, for example, a high volume level (e.g., a highest or maximum volume level) of a loudest audio signal of the content. The lowest or minimum audio indicator can indicate, for example, a low volume level (e.g., a lowest or minimum volume level) of a quietest audible audio signal of the content.

At 1104, the audio indicators can be analyzed. At 1106, the highest or maximum volume level of the loudest audio signal of the content and the lowest or minimum volume level of the quietest audible audio signal of the content can be determined based at least in part on the results of the analysis. The audio manager component can analyze the highest or maximum audio indicator and the lowest or minimum audio indicator to respectively identify or determine the highest or maximum volume level of the loudest audio signal of the content and the lowest or minimum volume level of the quietest audible audio signal of the content.

At 1108, a set point, an upper threshold volume level, a lower threshold volume level, and/or an audio adjustment mapping can be determined based at least in part on the highest or maximum volume level and the lowest or minimum volume level identified in the content, in accordance with a defined control criterion. At 1110, to facilitate controlling volume levels of respective audio signals of the content, respective volume levels of the respective audio signals of the content can be adjusted (or maintained as-is) to respective adjusted volume levels to generate respective adjusted audio signals, based at least in part on the set point, the upper threshold volume level, the lower threshold volume level, and/or the audio adjustment mapping.

At 1112, the respective adjusted audio signals (and audio signals maintained as-is) and associated other content (e.g., associated video content) can be presented. The audio manager component can perform the operations described with regard to reference numerals 1108, 1110, and 1112, for example, in a same or similar manner as described herein with regard to the corresponding operations of the method 1000 or as otherwise described herein.

Figure 12:
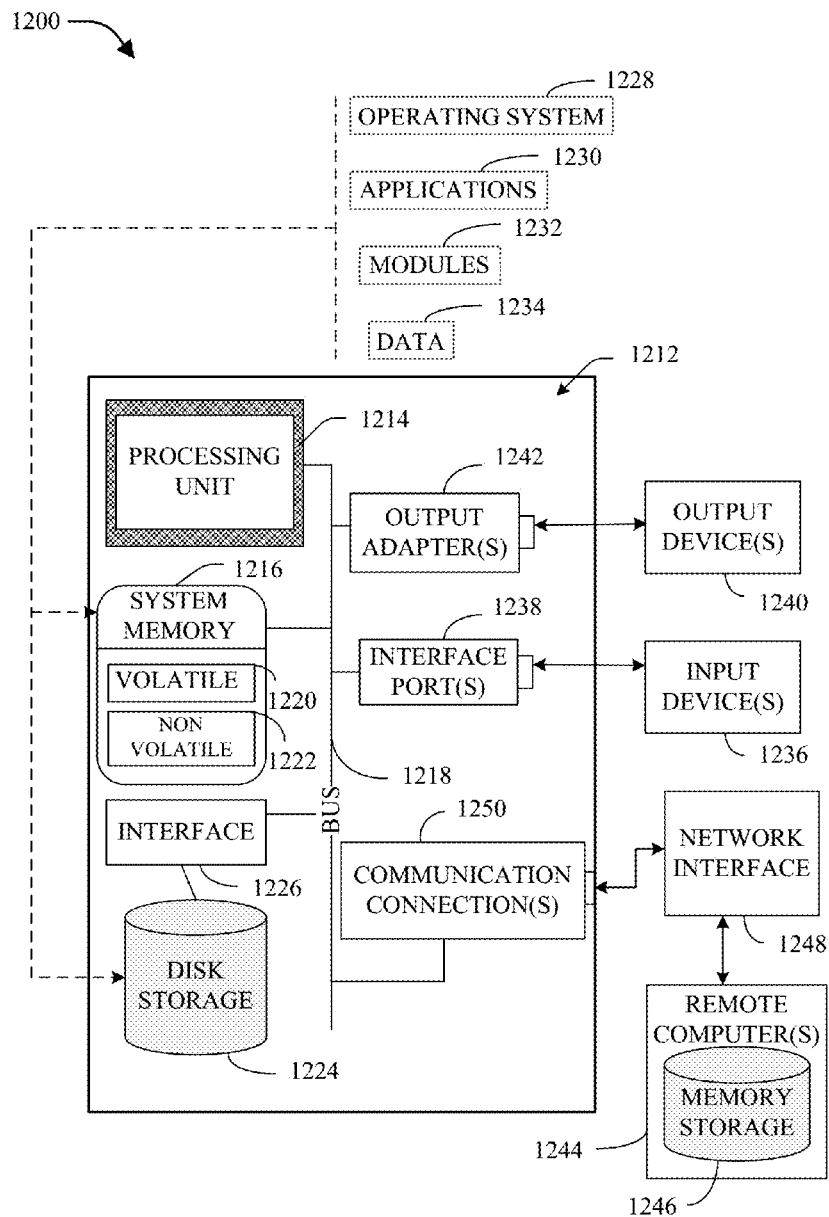
FIG. 12 is a schematic block diagram illustrating a suitable operating environment.
Figure 13:
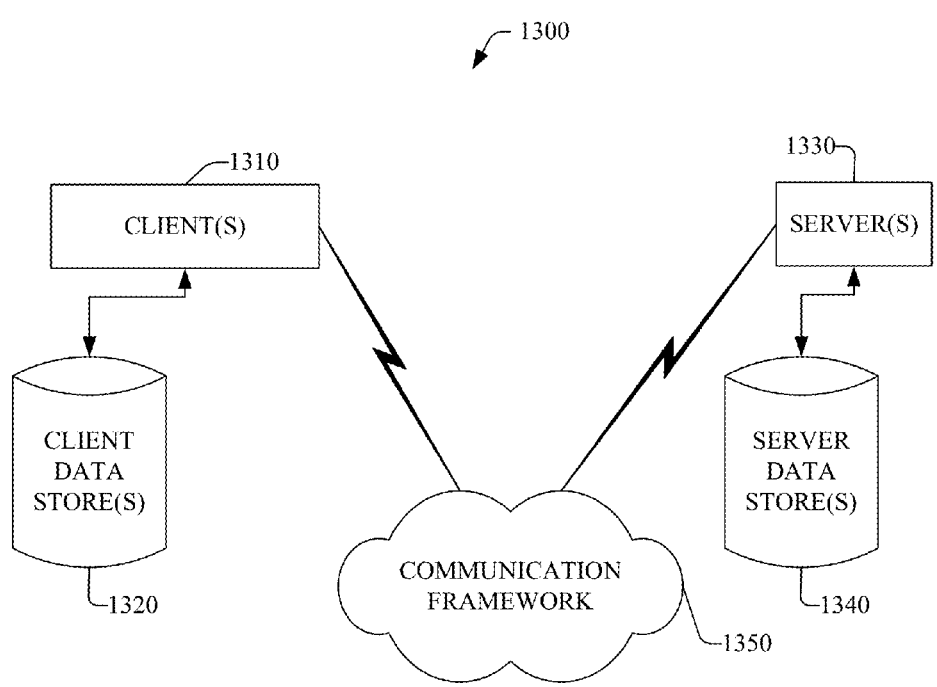
FIG. 13 is a schematic block diagram of a sample-computing environment.

In order to provide a context for the various aspects of the disclosed subject matter, FIGS. 12 and 13 as well as the following discussion are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that this disclosure also can or may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., mobile phone, electronic tablets or pads, laptop computers, PDAs, . . . ), microprocessor-based or programmable consumer or industrial electronics, and the like. The illustrated aspects may also be practiced in distributed computing environments where tasks are performed by remote processing devices that are linked through a communications network. However, some, if not all aspects of this disclosure can be practiced on stand-alone computers. In a distributed computing environment, program modules may be located in both local and remote memory storage devices.

With reference to FIG. 12, a suitable environment 1200 for implementing various aspects of this disclosure includes a computer 1212. The computer 1212 includes a processing unit 1214, a system memory 1216, and a system bus 1218. It is to be appreciated that the computer 1212 can be used in connection with implementing one or more of the systems, components, or methods shown and described in connection with FIGS. 1-11, or otherwise described herein. The system bus 1218 couples system components including, but not limited to, the system memory 1216 to the processing unit 1214. The processing unit 1214 can be any of various available processors. Dual microprocessors and other multiprocessor architectures also can be employed as the processing unit 1214.

The system bus 1218 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1216 includes volatile memory 1220 and nonvolatile memory 1222. The basic input/output system (BIOS), containing the basic routines to transfer information between elements within the computer 1212, such as during start-up, is stored in nonvolatile memory 1222. By way of illustration, and not limitation, nonvolatile memory 1222 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1220 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1212 also includes removable/non-removable, volatile/non-volatile computer storage media. FIG. 12 illustrates, for example, a disk storage 1224. Disk storage 1224 includes, but is not limited to, devices like a magnetic disk drive, floppy disk drive, tape drive, Jaz drive, Zip drive, LS-100 drive, flash memory card, or memory stick. The disk storage 1224 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1224 to the system bus 1218, a removable or non-removable interface is typically used, such as interface 1226.

FIG. 12 also depicts software that acts as an intermediary between users and the basic computer resources described in the suitable operating environment 1200. Such software includes, for example, an operating system 1228. Operating system 1228, which can be stored on disk storage 1224, acts to control and allocate resources of the computer system 1212. System applications 1230 take advantage of the management of resources by operating system 1228 through program modules 1232 and program data 1234 stored, e.g., in system memory 1216 or on disk storage 1224. It is to be appreciated that this disclosure can be implemented with various operating systems or combinations of operating systems.

A user enters commands or information into the computer 1212 through input device(s) 1236. Input devices 1236 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1214 through the system bus 1218 via interface port(s) 1238. Interface port(s) 1238 include, for example, a serial port, a parallel port, a game port, and a universal serial bus (USB). Output device(s) 1240 use some of the same type of ports as input device(s) 1236. Thus, for example, a USB port may be used to provide input to computer 1212, and to output information from computer 1212 to an output device 1240. Output adapter 1242 is provided to illustrate that there are some output devices 1240 like monitors, speakers, and printers, among other output devices 1240, which require special adapters. The output adapters 1242 include, by way of illustration and not limitation, video and sound cards that provide a means of connection between the output device 1240 and the system bus 1218. It should be noted that other devices and/or systems of devices provide both input and output capabilities such as remote computer(s) 1244.

Computer 1212 can operate in a networked environment using logical connections to one or more remote computers, such as remote computer(s) 1244. The remote computer(s) 1244 can be a personal computer, a server, a router, a network PC, a workstation, a microprocessor based appliance, a peer device or other common network node and the like, and typically includes many or all of the elements described relative to computer 1212. For purposes of brevity, only a memory storage device 1246 is illustrated with remote computer(s) 1244. Remote computer(s) 1244 is logically connected to computer 1212 through a network interface 1248 and then physically connected via communication connection 1250. Network interface 1248 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1250 refers to the hardware/software employed to connect the network interface 1248 to the bus 1218. While communication connection 1250 is shown for illustrative clarity inside computer 1212, it can also be external to computer 1212. The hardware/software necessary for connection to the network interface 1248 includes, for exemplary purposes only, internal and external technologies such as, modems including regular telephone grade modems, cable modems and DSL modems, ISDN adapters, and Ethernet cards.

FIG. 13 is a schematic block diagram of a sample-computing environment 1300 (e.g., computing system) with which the subject matter of this disclosure can interact. The system 1300 includes one or more client(s) 1310. The client(s) 1310 can be hardware and/or software (e.g., threads, processes, computing devices). The system 1300 also includes one or more server(s) 1330. Thus, system 1300 can correspond to a two-tier client server model or a multi-tier model (e.g., client, middle tier server, data server), amongst other models. The server(s) 1330 can also be hardware and/or software (e.g., threads, processes, computing devices). The servers 1330 can house threads to perform transformations by employing this disclosure, for example. One possible communication between a client 1310 and a server 1330 may be in the form of a data packet transmitted between two or more computer processes.

The system 1300 includes a communication framework 1350 that can be employed to facilitate communications between the client(s) 1310 and the server(s) 1330. The client(s) 1310 are operatively connected to one or more client data store(s) 1320 that can be employed to store information local to the client(s) 1310. Similarly, the server(s) 1330 are operatively connected to one or more server data store(s) 1340 that can be employed to store information local to the servers 1330.

It is to be noted that aspects, features, and/or advantages of the disclosed subject matter can be exploited in substantially any wireless telecommunication or radio technology, e.g., Wi-Fi; Gi-Fi; Hi-Fi; Bluetooth; worldwide interoperability for microwave access (WiMAX); enhanced general packet radio service (enhanced GPRS); third generation partnership project (3GPP) long term evolution (LTE); third generation partnership project 2 (3GPP2) ultra mobile broadband (UMB); 3GPP universal mobile telecommunication system (UMTS); high speed packet access (HSPA); high speed downlink packet access (HSDPA); high speed uplink packet access (HSUPA); GSM (global system for mobile communications) EDGE (enhanced data rates for GSM evolution) radio access network (GERAN); UMTS terrestrial radio access network (UTRAN); LTE advanced (LTE-A); etc. Additionally, some or all of the aspects described herein can be exploited in legacy telecommunication technologies, e.g., GSM. In addition, mobile as well non-mobile networks (e.g., the internet, data service network such as internet protocol television (IPTV), etc.) can exploit aspects or features described herein.

Various aspects or features described herein can be implemented as a method, apparatus, system, or article of manufacture using standard programming or engineering techniques. In addition, various aspects or features disclosed in the subject specification can also be realized through program modules that implement at least one or more of the methods disclosed herein, the program modules being stored in a memory and executed by at least a processor. Other combinations of hardware and software or hardware and firmware can enable or implement aspects described herein, including disclosed method(s). The term "article of manufacture" as used herein is intended to encompass a computer program accessible from any computer-readable device, carrier, or storage media. For example, computer-readable storage media can include but are not limited to magnetic storage devices (e.g., hard disk, floppy disk, magnetic strips, etc.), optical discs (e.g., compact disc (CD), digital versatile disc (DVD), blu-ray disc (BD), etc.), smart cards, and memory devices comprising volatile memory and/or non-volatile memory (e.g., flash memory devices, such as, for example, card, stick, key drive, etc.), or the like. In accordance with various implementations, computer-readable storage media can be non-transitory computer-readable storage media and/or a computer-readable storage device can comprise computer-readable storage media.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. A processor can be or can comprise, for example, multiple processors that can include distributed processors or parallel processors in a single machine or multiple machines. Additionally, a processor can comprise or refer to an integrated circuit, an application specific integrated circuit (ASIC), a digital signal processor (DSP), a programmable gate array (PGA), a field PGA (FPGA), a programmable logic controller (PLC), a complex programmable logic device (CPLD), a state machine, a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor may also be implemented as a combination of computing processing units.

A processor can facilitate performing various types of operations, for example, by executing computer-executable instructions. When a processor executes instructions to perform operations, this can include the processor performing (e.g., directly performing) the operations and/or the processor indirectly performing operations, for example, by facilitating (e.g., facilitating operation of), directing, controlling, or cooperating with one or more other devices or components to perform the operations. In some implementations, a memory can store computer-executable instructions, and a processor can be communicatively coupled to the memory, wherein the processor can access or retrieve computer-executable instructions from the memory and can facilitate execution of the computer-executable instructions to perform operations.

In certain implementations, a processor can be or can comprise one or more processors that can be utilized in supporting a virtualized computing environment or virtualized processing environment. The virtualized computing environment may support one or more virtual machines representing computers, servers, or other computing devices. In such virtualized virtual machines, components such as processors and storage devices may be virtualized or logically represented.

In the subject specification, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory.

By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

As used in this application, the terms "component", "system", "platform", "framework", "layer", "interface", "agent", and the like, can refer to and/or can include a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

In another example, respective components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Moreover, terms like "user equipment" (UE), "mobile station," "mobile," "wireless device," "wireless communication device," "subscriber station," "subscriber equipment," "access terminal," "terminal," "handset," and similar terminology are used herein to refer to a wireless device utilized by a subscriber or user of a wireless communication service to receive or convey data, control, voice, video, sound, gaming, or substantially any data-stream or signaling-stream. The foregoing terms are utilized interchangeably in the subject specification and related drawings. Likewise, the terms "access point" (AP), "base station," "node B," "evolved node B" (eNode B or eNB), "home node B" (HNB), "home access point" (HAP), and the like are utilized interchangeably in the subject application, and refer to a wireless network component or appliance that serves and receives data, control, voice, video, sound, gaming, or substantially any data-stream or signaling-stream from a set of subscriber stations. Data and signaling streams can be packetized or frame-based flows.

Furthermore, the terms "user," "subscriber," "customer," "consumer," "owner," "agent," and the like are employed interchangeably throughout the subject specification, unless context warrants particular distinction(s) among the terms. It should be appreciated that such terms can refer to human entities or automated components supported through artificial intelligence (e.g., a capacity to make inference based on complex mathematical formalisms), which can provide simulated vision, sound recognition and so forth.

As used herein, the terms "example," "exemplary," and/or "demonstrative" are utilized to mean serving as an example, instance, or illustration. For the avoidance of doubt, the subject matter disclosed herein is not limited by such examples. In addition, any aspect or design described herein as an "example," "exemplary," and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive, in a manner similar to the term "comprising" as an open transition word, without precluding any additional or other elements.

It is to be appreciated and understood that components (e.g., device, communication device, presentation component, remote control component, audio manager component, communication network, macro communication network, micro communication network, processor component, data store, . . . ), as described with regard to a particular system or method, can include the same or similar functionality as respective components (e.g., respectively named components or similarly named components) as described with regard to other systems or methods disclosed herein.

What has been described above includes examples of systems and methods that provide advantages of the disclosed subject matter. It is, of course, not possible to describe every conceivable combination of components or methods for purposes of describing the disclosed subject matter, but one of ordinary skill in the art may recognize that many further combinations and permutations of the disclosed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A method, comprising:
   monitoring, by a system comprising a processor, respective volume levels of respective audio signals of media content being presented;
   determining, by the system, a mapping that interpolates respective adjusted volume levels of a first portion of the respective audio signals as a function of a second portion of the respective volume levels of the respective audio signals, a first difference between a first defined threshold volume level and a set point volume level that is lower than the first defined threshold volume level, and a higher volume level of a higher volume audio signal, wherein the higher volume level of the higher volume audio signal is higher than other volume levels of the second portion of the respective volume levels of other audio signals of the first portion of the respective audio signals; and
   controlling, by the system, the respective volume levels of the respective audio signals of the media content by adjusting the respective volume levels of the respective audio signals to the respective adjusted volume levels based on the mapping.

2. The method of claim 1, further comprising:
   receiving, by the system, the set point volume level; and
   generating, by the system, the mapping that interpolates the respective adjusted volume levels of the respective audio signals as a function of the respective volume levels of the respective audio signals, the first defined threshold volume level, a second defined threshold volume level, and the set point volume level, and wherein the second defined threshold volume level is lower than the set point volume level.

3. The method of claim 2, wherein the mapping interpolates the respective adjusted volume levels of the first portion of the respective audio signals as a function of the respective volume levels of the respective audio signals, the first difference between the first defined threshold volume level and the set point volume level, and a second difference between the second defined threshold volume level and the set point volume level.

4. The method of claim 2, further comprising:
   determining, by the system, the respective volume levels of the respective audio signals of the media content based on analyzing the respective audio signals of the media content; and
   identifying, by the system, the higher volume level of the higher volume audio signal of the respective audio signals.

5. The method of claim 4, wherein the identifying the higher volume level of the higher volume audio signal further comprises identifying the higher volume level of the higher volume audio signal of the respective audio signals based on a higher volume indicator that indicates the higher volume level of the higher volume audio signal, and wherein the higher volume indicator is received in connection with receiving the media content.

6. The method of claim 4, wherein the mapping interpolates the respective adjusted volume levels of the first portion of the respective audio signals as a function of the second portion of the respective volume levels of the respective audio signals, the first difference between the first defined threshold volume level and the set point volume level, a second difference between the second defined threshold volume level and the set point volume level, and a third difference between the higher volume level of the higher volume audio signal and the first defined threshold volume level.

7. The method of claim 1, wherein a volume level of an audio signal of the second portion of the respective volume levels is higher than the set point volume level, and wherein the adjusting the respective volume levels of the respective audio signals to the respective adjusted volume levels comprises decreasing the volume level of the audio signal to an adjusted volume level of the respective adjusted volume levels that is higher than the set point volume level.

8. The method of claim 1, wherein a volume level of an audio signal of the second portion of the respective volume levels is higher than the first defined threshold volume level, and wherein the adjusting the respective volume levels of the respective audio signals to the respective adjusted volume levels comprises decreasing the volume level of the audio signal to an adjusted volume level of the respective adjusted volume levels that is higher than the set point volume level and to at least as low as the first defined threshold volume level.

9. The method of claim 1, wherein a volume level of an audio signal of the second portion of the respective volume levels is lower than the set point volume level, and wherein the adjusting the respective volume levels of the respective audio signals to the respective adjusted volume levels comprises increasing the volume level of the audio signal to an adjusted volume level of the respective adjusted volume levels that is lower than the set point volume level.

10. The method of claim 1, wherein the set point volume level is a first set point volume level associated with a first frequency band, wherein the first defined threshold volume level is associated with the first frequency band, wherein the mapping is a first mapping associated with the first frequency band, and wherein the method further comprises:
    generating, by the system, the first mapping that interpolates the first portion of respective adjusted volume levels of the respective audio signals in the first frequency band as a function of the second portion of respective volume levels of the respective audio signals in the first frequency band, the first defined threshold volume level, a second defined threshold volume level associated with the first frequency band, and the first set point volume level, wherein the first defined threshold volume level is higher than the first set point volume level, and wherein the second defined threshold volume level is lower than the first set point volume level; and generating, by the system, a second mapping associated with a second frequency band, wherein the second mapping interpolates a third portion of the respective adjusted volume levels of the respective audio signals in the second frequency band as a function of a fourth portion of the respective volume levels of the respective audio signals in the second frequency band, a third defined threshold volume level associated with the second frequency band, a fourth defined threshold volume level associated with the second frequency band, and a second set point volume level associated with the second frequency band, wherein the third defined threshold volume level is higher than the second set point volume level, and wherein the fourth defined threshold volume level is lower than the second set point volume level.

11. The method of claim 10, wherein the controlling the respective volume levels of the respective audio signals of the media content further comprises:

controlling, by the system, the first volume level of a first content portion of the media content associated with the first frequency band based on the first mapping associated with the first frequency band; and controlling, by the system, a second volume level of a second content portion of the media content associated with the second frequency band based on the second mapping associated with the second frequency band.

12. A system, comprising:

a processor; and a memory that stores executable instructions that, when executed by the processor, facilitate performance of operations, comprising:

analyzing respective audio signals of content to determine respective volume levels of the respective audio signals, wherein the content is received from a first device for presentation via a second device;

generating a mapping that interpolates respective modified volume levels of a first portion of the respective audio signals as a function of a second portion of the respective volume levels of the respective audio signals, a first difference between a first defined threshold volume level and a set point volume level that is lower than the first defined threshold volume level, and an upper volume level of an upper volume audio signal, wherein the upper volume level of the upper volume audio signal is higher than other volume levels of the second portion of the respective volume levels of other audio signals of the first portion of the respective audio signals; and controlling the respective volume levels of the respective audio signals of the content by modifying the respective volume levels to the respective modified volume levels based on the mapping, wherein the set point volume level is determined based on input data received from a user identity.

13. The system of claim 12, wherein the operations further comprise:

analyzing the first portion of the respective audio signals of the content to determine the second portion of the respective volume levels of the first portion of the respective audio signals;

determining the upper volume level of the upper volume audio signal of the first portion of the respective audio signals based on a result of the analyzing; and generating the mapping that interpolates respective modified volume levels of the first portion of the respective audio signals as a function of the second portion of the respective volume levels of the respective audio signals, the upper volume level of the upper volume audio signal, the first difference between the first defined threshold volume level and the set point volume level, and a second difference between a second defined threshold volume level and the set point volume level wherein the second defined threshold volume level is lower than the set point volume level.

14. The system of claim 12, wherein the operations further comprise:

determining the upper volume level of the upper volume audio signal of the first portion of the respective audio signals of the content based on an audio indicator received from the first device in connection with receiving the content, wherein the audio indicator indicates the upper volume level of the upper volume audio signal; and generating the mapping that interpolates respective modified volume levels of the first portion of the respective audio signals as a function of the second portion of the respective volume levels of the respective audio signals, the upper volume level of the upper volume audio signal, the first difference between the first defined threshold volume level and the set point volume level, and a second difference between a second defined threshold volume level and the set point volume level wherein the second defined threshold volume level is lower than the set point volume level.

15. The system of claim 12, wherein the respective modified volume levels comprise a modified volume level, wherein the respective volume levels of the respective audio signals comprise a volume level of an audio signal, and wherein the operations further comprise:

interpolating the modified volume level of the audio signal based on the volume level of the audio signal, in accordance with the mapping;

modifying the volume level to the modified volume level; and presenting the audio signal at the modified volume level.

16. The system of claim 15, wherein the volume level is higher than the set point volume level, and wherein the modified volume level is lower than the volume level.

17. The system of claim 15, wherein the volume level is lower than the set point volume level, and wherein the modified volume level is higher than the volume level.

18. The system of claim 12, wherein the second device is a member of a group of devices comprising a set-top box, a computer, a media player device, an electronic tablet, an electronic pad, and an audio player device.

19. A non-transitory machine-readable storage medium, comprising executable instructions that, when executed by a processor, facilitate performance of operations, comprising:

monitoring respective first volume amounts of respective items of audio information of media information being presented;

determining a mapping that interpolates respective second volume amounts of a second portion of the respective items of audio information based on a first portion of the respective first volume amounts of the respective items of audio information, a first difference between a first defined threshold volume amount and a set point volume amount that is lower than the first defined threshold volume amount, and a higher volume amount of a higher volume item of audio information, wherein the higher volume amount of the higher volume item of audio information is higher than other first volume amounts of the first portion of the respective first volume amounts of other items of audio information of the respective items of audio information; and controlling respective adjustments of the respective first volume amounts of the respective items of audio information to adjust the respective first volume amounts to the respective second volume amounts based on the mapping, wherein the set point volume amount and the first defined threshold volume amount are received from a device associated with a user identity.

20. The non-transitory machine-readable storage medium of claim 19, wherein the first portion of the respective first volume amounts comprise a first volume amount of an item of information of the respective items of audio information, wherein the respective second volume amounts comprise a second volume amount of the item of information, and wherein the operations further comprise:

generating the mapping based on the first portion of the respective first volume amounts, comprising the first volume amount, of the respective items of audio information of the media information, the first difference between the first defined threshold volume amount and the set point volume amount, and a second difference between a second defined threshold volume amount and the set point volume amount, wherein the second defined threshold volume amount is lower than the set point volume amount;

determining the first volume amount of the item of audio information based on analyzing the item of audio information;

determining the second volume amount of the item of the audio information based on the volume amount and the mapping;

adjusting the first volume amount of the item of audio information to the second volume amount, in response to determining the second volume amount; and rendering the item of audio information at the second volume amount.

* * * * *